US012065738B2

(12) United States Patent
Mane et al.

(10) Patent No.: US 12,065,738 B2
(45) Date of Patent: Aug. 20, 2024

(54) METHOD OF MAKING THIN FILMS OF SODIUM FLUORIDES AND THEIR DERIVATIVES BY ALD

(71) Applicants: UCHICAGO ARGONNE, LLC, Chicago, IL (US); BOISE STATE UNIVERSITY, Boise, ID (US)

(72) Inventors: Anil U. Mane, Naperville, IL (US); Jeffrey W. Elam, Elmhurst, IL (US); Donghyeon Kang, Chicago, IL (US); Sara Kuraitis, Boise, ID (US); Elton Graugnard, Boise, ID (US)

(73) Assignees: UCHICAGO ARGONNE, LLC, Chicago, IL (US); BOISE STATE UNIVERSITY, Boise, ID (US)

( * ) Notice: Subject to any disclaimer, the term of this patent is extended or adjusted under 35 U.S.C. 154(b) by 177 days.

(21) Appl. No.: 17/508,802

(22) Filed: Oct. 22, 2021

(65) Prior Publication Data
US 2023/0126417 A1    Apr. 27, 2023

(51) Int. Cl.
C23C 16/455    (2006.01)
C23C 16/44     (2006.01)
C23C 16/52     (2006.01)

(52) U.S. Cl.
CPC .... *C23C 16/45553* (2013.01); *C23C 16/4408* (2013.01); *C23C 16/45527* (2013.01); *C23C 16/52* (2013.01)

(58) Field of Classification Search
None
See application file for complete search history.

(56) References Cited

U.S. PATENT DOCUMENTS

| 3,233,014 A | 2/1966 | Bickerdike et al. |
| 3,238,054 A | 3/1966 | Bickerdike et al. |
| 3,369,920 A | 2/1968 | Bourdeau et al. |
| 3,520,667 A | 7/1970 | Taylor |
| 3,537,426 A | 11/1970 | Spiller |
| 3,673,051 A | 6/1972 | Clark et al. |
| 3,673,457 A | 6/1972 | Sackinger et al. |

(Continued)

FOREIGN PATENT DOCUMENTS

| EP | 0 256 073 B1 | 2/1988 |
| FR | 2980486 A1 | 3/2013 |

(Continued)

OTHER PUBLICATIONS

Kuraitis et al ("Atomic later deposition of sodium fluoride thin films", Kuraitis et al, J. Vac. Sci. Technol. A 39, 032405 (2021), Mar. 9, 2021, 7 pages) (Year: 2021).*

(Continued)

*Primary Examiner* — Michael G Miller
(74) *Attorney, Agent, or Firm* — FOLEY & LARDNEY LLP

(57) ABSTRACT

A method of making thin films of sodium fluorides and their derivatives by atomic layer deposition ("ALD"). A sodium precursor is exposed to a substrate in an ALD reactor. The sodium precursor is purged, leaving the substrate with a sodium intermediate bound thereon. A fluorine precursor is exposed to the bound sodium intermediate in the ALD reactor. The fluorine precursor is purged and a sodium fluoride film is formed on the substrate.

20 Claims, 16 Drawing Sheets

(56) References Cited

U.S. PATENT DOCUMENTS

| | | |
|---|---|---|
| 3,739,216 A | 6/1973 | Pakswer |
| 3,895,084 A | 7/1975 | Bauer |
| 3,991,248 A | 11/1976 | Bauer |
| 4,051,403 A | 9/1977 | Feingold et al. |
| 4,341,592 A | 7/1982 | Shortes et al. |
| 4,569,805 A | 2/1986 | Hume et al. |
| 4,625,106 A | 11/1986 | Bender et al. |
| 4,757,229 A | 7/1988 | Schmidt et al. |
| 4,823,734 A | 4/1989 | Christin |
| 4,853,020 A | 8/1989 | Sink |
| 4,894,160 A | 1/1990 | Abe et al. |
| 4,912,314 A | 3/1990 | Sink |
| 4,963,393 A | 10/1990 | Goela et al. |
| 5,039,357 A | 8/1991 | Epler et al. |
| 5,048,807 A | 9/1991 | Martinez et al. |
| 5,068,634 A | 11/1991 | Shrier |
| 5,086,248 A | 2/1992 | Horton et al. |
| 5,126,249 A | 6/1992 | Becker et al. |
| 5,141,775 A | 8/1992 | Patrigeon et al. |
| 5,154,948 A | 10/1992 | Patrigeon et al. |
| 5,160,544 A | 11/1992 | Garg et al. |
| 5,177,878 A | 1/1993 | Visser |
| 5,202,158 A | 4/1993 | Sakagami et al. |
| 5,216,249 A | 6/1993 | Jones et al. |
| 5,334,840 A | 8/1994 | Newacheck et al. |
| 5,350,480 A | 9/1994 | Gray |
| 5,378,960 A | 1/1995 | Tasker et al. |
| 5,391,101 A | 2/1995 | Aebi et al. |
| 5,402,034 A | 3/1995 | Blouch et al. |
| 5,472,650 A | 12/1995 | Johnson et al. |
| 5,480,678 A | 1/1996 | Rudolph et al. |
| 5,529,950 A | 6/1996 | Hoenlein et al. |
| 5,726,076 A | 3/1998 | Tasker et al. |
| 5,738,908 A | 4/1998 | Rey et al. |
| 5,820,686 A | 10/1998 | Moore |
| 5,904,957 A | 5/1999 | Christin et al. |
| 5,914,278 A | 6/1999 | Boitnott et al. |
| 5,916,633 A | 6/1999 | Lackey et al. |
| 5,945,177 A | 8/1999 | Hack et al. |
| 5,964,320 A | 10/1999 | Kato et al. |
| 5,997,713 A | 12/1999 | Beetz et al. |
| 6,197,374 B1 | 3/2001 | Huttinger et al. |
| 6,200,893 B1 | 3/2001 | Sneh |
| 6,300,640 B1 | 10/2001 | Bhargava et al. |
| 6,311,001 B1 | 10/2001 | Rosine |
| 6,420,279 B1 | 7/2002 | Ono et al. |
| 6,479,826 B1 | 11/2002 | Klann et al. |
| 6,495,837 B2 | 12/2002 | Odom et al. |
| 6,503,330 B1 | 1/2003 | Sneh et al. |
| 6,545,281 B1 | 4/2003 | McGregor et al. |
| 6,572,371 B1 | 6/2003 | Sion et al. |
| 6,585,823 B1 | 7/2003 | Van Wijck |
| 6,613,383 B1 | 9/2003 | George et al. |
| 6,669,988 B2 | 12/2003 | Daws et al. |
| 6,713,177 B2 | 3/2004 | George et al. |
| 6,876,711 B2 | 4/2005 | Wallace et al. |
| 6,913,827 B2 | 7/2005 | George et al. |
| 7,164,138 B2 | 1/2007 | McGregor et al. |
| 7,187,487 B2 | 3/2007 | Przybyla et al. |
| 7,233,007 B2 | 6/2007 | Downing et al. |
| 7,335,594 B1 | 2/2008 | Wang et al. |
| 7,557,229 B2 | 7/2009 | Gordon et al. |
| 7,595,270 B2 | 9/2009 | Elers et al. |
| 7,759,138 B2 | 7/2010 | Beaulieu et al. |
| 7,842,214 B2 | 11/2010 | Romdhane et al. |
| 7,855,493 B2 | 12/2010 | Sullivan et al. |
| 7,892,646 B1 | 2/2011 | Rudolph et al. |
| 7,972,569 B2 | 7/2011 | Elam et al. |
| 7,977,617 B2 | 7/2011 | Sullivan et al. |
| 7,981,472 B2 | 7/2011 | Dalton et al. |
| 8,052,884 B2 | 11/2011 | Sullivan et al. |
| 8,101,480 B1 | 1/2012 | Kim et al. |
| 8,344,241 B1 | 1/2013 | Vidu et al. |
| 8,404,878 B2 | 3/2013 | Pallem et al. |
| 8,604,440 B2 | 12/2013 | Frisch et al. |
| 8,969,823 B2 | 3/2015 | Elam et al. |
| 9,255,327 B2 | 2/2016 | Winter et al. |
| 9,263,689 B2 | 2/2016 | O'Carroll et al. |
| 9,382,615 B2 | 7/2016 | Mantymaki et al. |
| 9,704,900 B1 | 7/2017 | Xia et al. |
| 10,497,530 B2 | 12/2019 | Feigelson et al. |
| 10,515,798 B2 | 12/2019 | Park et al. |
| 10,796,874 B2 | 10/2020 | Wagner et al. |
| 11,111,578 B1 | 9/2021 | Elam et al. |
| 2001/0000104 A1 | 4/2001 | Li et al. |
| 2001/0037761 A1 | 11/2001 | Ries et al. |
| 2002/0021064 A1 | 2/2002 | Devoe et al. |
| 2002/0042344 A1 | 4/2002 | Kondo et al. |
| 2002/0067789 A1 | 6/2002 | Wallace et al. |
| 2002/0076491 A1 | 6/2002 | Delperier et al. |
| 2002/0088714 A1 | 7/2002 | Motoi et al. |
| 2003/0054149 A1 | 3/2003 | Pan |
| 2003/0091788 A1 | 5/2003 | Schroder et al. |
| 2003/0118728 A1 | 6/2003 | Sion et al. |
| 2003/0138560 A1 | 7/2003 | Zhao et al. |
| 2003/0205203 A1 | 11/2003 | Sion et al. |
| 2004/0028813 A1 | 2/2004 | Thebault et al. |
| 2004/0045932 A1 | 3/2004 | Kochergin et al. |
| 2004/0083967 A1 | 5/2004 | Yuda et al. |
| 2004/0087168 A1 | 5/2004 | Granneman et al. |
| 2004/0134879 A1 | 7/2004 | Kochergin et al. |
| 2004/0253377 A1 | 12/2004 | Bok et al. |
| 2004/0255843 A1 | 12/2004 | Yoshida et al. |
| 2005/0082007 A1 | 4/2005 | Nguyen et al. |
| 2005/0133166 A1 | 6/2005 | Satitpunwaycha et al. |
| 2006/0046059 A1 | 3/2006 | Arico et al. |
| 2006/0062910 A1 | 3/2006 | Meiere |
| 2006/0096911 A1 | 5/2006 | Brey et al. |
| 2006/0193979 A1 | 8/2006 | Meiere et al. |
| 2006/0263525 A1 | 11/2006 | Sion et al. |
| 2007/0031609 A1 | 2/2007 | Kumar et al. |
| 2007/0131849 A1 | 6/2007 | Beaulieu et al. |
| 2007/0217119 A1 | 9/2007 | Johnson et al. |
| 2007/0259130 A1 | 11/2007 | Von Kaenel et al. |
| 2007/0264840 A1 | 11/2007 | Itatani et al. |
| 2008/0066684 A1 | 3/2008 | Patalay et al. |
| 2008/0069951 A1 | 3/2008 | Chacin et al. |
| 2008/0113097 A1 | 5/2008 | Mahajani et al. |
| 2008/0124462 A1 | 5/2008 | Waghray et al. |
| 2008/0223795 A1 | 9/2008 | Bakajin et al. |
| 2008/0237919 A1 | 10/2008 | Liu et al. |
| 2008/0241503 A1 | 10/2008 | Romdhane et al. |
| 2008/0286448 A1 | 11/2008 | Elam et al. |
| 2009/0137043 A1 | 5/2009 | Parsons et al. |
| 2009/0194233 A1 | 8/2009 | Tamura et al. |
| 2009/0206057 A1 | 8/2009 | Huang et al. |
| 2009/0212680 A1 | 8/2009 | Tremsin et al. |
| 2009/0215211 A1 | 8/2009 | Tremsin et al. |
| 2009/0315443 A1 | 12/2009 | Sullivan et al. |
| 2009/0324829 A1 | 12/2009 | Dalton et al. |
| 2010/0044577 A1 | 2/2010 | Sullivan et al. |
| 2010/0068132 A1 | 3/2010 | Vencill et al. |
| 2010/0075131 A1 | 3/2010 | Etzel et al. |
| 2010/0075445 A1 | 3/2010 | Beaulieu et al. |
| 2010/0075560 A1 | 3/2010 | Seshadri et al. |
| 2010/0080841 A1 | 4/2010 | Porbeni et al. |
| 2010/0093527 A1 | 4/2010 | Hasselmann |
| 2010/0178468 A1 | 7/2010 | Jiang et al. |
| 2010/0189900 A1 | 7/2010 | Dickey et al. |
| 2011/0135842 A1 | 6/2011 | Faguet et al. |
| 2011/0220802 A1 | 9/2011 | Frisch et al. |
| 2011/0229838 A1 | 9/2011 | Kalgutkar et al. |
| 2011/0250354 A1 | 10/2011 | Pallem et al. |
| 2011/0253046 A1 | 10/2011 | Dalton et al. |
| 2011/0268624 A1 | 11/2011 | Chandler et al. |
| 2012/0000886 A1 | 1/2012 | Honda et al. |
| 2012/0070794 A1 | 3/2012 | Craig et al. |
| 2012/0171376 A1 | 7/2012 | Dodge |
| 2012/0171403 A1 | 7/2012 | Dodge |
| 2012/0187305 A1 | 7/2012 | Elam et al. |
| 2012/0308739 A1 | 12/2012 | Lansalot-Matras et al. |
| 2013/0001156 A1 | 1/2013 | Takeno |
| 2013/0014799 A1 | 1/2013 | Vidu et al. |
| 2013/0025538 A1 | 1/2013 | Collins et al. |

(56) References Cited

U.S. PATENT DOCUMENTS

| | | | |
|---|---|---|---|
| 2013/0048629 | A1 | 2/2013 | Kang et al. |
| 2013/0164456 | A1 | 6/2013 | Winter et al. |
| 2013/0186452 | A1 | 7/2013 | Argo et al. |
| 2013/0189810 | A1 | 7/2013 | Argo et al. |
| 2013/0263776 | A1 | 10/2013 | Pitney et al. |
| 2013/0280546 | A1 | 10/2013 | Elam et al. |
| 2013/0335190 | A1 | 12/2013 | Elam et al. |
| 2014/0106070 | A1 | 4/2014 | Mantymaki et al. |
| 2014/0220244 | A1 | 8/2014 | Mane et al. |
| 2014/0225091 | A1 | 8/2014 | O'Carroll et al. |
| 2014/0272432 | A1 | 9/2014 | Dodge et al. |
| 2015/0125599 | A1 | 5/2015 | Lindfors et al. |
| 2018/0094352 | A1 | 4/2018 | Mane et al. |
| 2018/0273550 | A1 | 9/2018 | Gordon et al. |
| 2019/0379056 | A1 | 12/2019 | Chen |
| 2021/0254209 | A1* | 8/2021 | Elam .................. C23C 16/4408 |

FOREIGN PATENT DOCUMENTS

| | | |
|---|---|---|
| GB | 1 163 979 A | 9/1969 |
| JP | 2000-182979 A | 6/2000 |
| JP | 2001-247970 A | 9/2001 |
| JP | 2005-306625 A | 11/2005 |
| JP | 2007-277105 A | 10/2007 |
| WO | WO-2009/045752 A2 | 4/2009 |
| WO | WO-2011/037798 A1 | 3/2011 |
| WO | WO-2011/037831 A2 | 3/2011 |
| WO | WO-2011/122059 A1 | 10/2011 |
| WO | WO-2012/099658 A2 | 7/2012 |
| WO | WO-2013/045788 A1 | 4/2013 |
| WO | WO-2013/066749 A1 | 5/2013 |
| WO | WO-2013/140021 A1 | 9/2013 |
| WO | WO-2013/171360 A1 | 11/2013 |
| WO | WO-2016/037656 A1 | 3/2016 |

OTHER PUBLICATIONS

"Anopore Inorganic Membranes," Whatman Product Catalog, pp. 67-69 (2009).
Ahmed, et al., "Electrode surface engineering by atomic layer deposition: A promising pathway toward better energy storage," Nano Today 11(2), pp. 250-271 (2016).
Andres, et al., "Decoupling of optoelectronic properties from morphological changes in sodium treated kesterite thin film solar cells," Solar Energy 175, pp. 94-100 (2018).
Attenkofer, et al., "A New Approach to Photocathode Development: From the Recipe to Theory Inspired Design," 6th International Conference on New Developments in Photon Detection, retrieved from http://lappddocs.uchicago.edu/documents/200 15 pages (2011).
Biemolt, et al., "Beyond Lithium-Based Batteries," Materials 13(2), 425, 31 pages (2020).
Binions, et al., "Aerosol-assisted chemical vapour deposition of sodium fluoride thin films," Thin Solid Films 469-470, pp. 416-419 (2004).
Bjorck & Andersson, "GenX: an extensible X-ray reflectivity refinement program utilizing differential evolution," Journal of Applied Crystallography 40(6), pp. 1174-1178 (2007).
Brown, et al., "Improved flexibility with grayscale fabrication of calcium fluoride homogenizers," Proceedings of SPIE 8326, 11 pages (2012).
Byrum, "Development of Large Area Fast Microchannel Plate Photodetectors," SPIE 2011 Defense Security & Sensing, retrieved from http://lappddocs.uchicago.edu/documents/189, 35 pages (2011).
Chen, et al., "Novel ALD Chemistry Enabled Low-Temperature Synthesis of Lithium Fluoride Coatings for Durable Lithium Anodes," ACS Applied Materials & Interfaces 10(32), pp. 26972-26981 (2018).
Elagin, "Performance of Microchannel Plates Fabricated Using Atomic Layer Deposition," IEEE Symposium on Radiation Measurements and Applications, retrieved from http://lappddocs.uchicago.edu/documents/186, 15 pages (2012).

Elam, et al., "Conformal coating on ultrahigh-aspect-ratio nanopores of anodic alumina by atomic layer deposition," Chemistry of Materials 15(18), pp. 3507-3517 (2003).
Elam, et al., "Viscous Flow Reactor with Quartz Crystal Microbalance for Thin Film Growth by Atomic Layer Deposition," Review of Scientific Instruments 73(8), pp. 2981-2987 (2002).
Elam, et al., "ZnO/Al2O3 nanolaminates fabricated by atomic layer deposition: growth and surface roughness measurements," Thin Solid Films 414(1), pp. 43-55 (2002).
Ertley, et al., "Microchannel plate detectors for future NASA UV observatories," Proceedings of SPIE 10699, 13 pages (2018).
Faubert, et al., "Activation and characterization of Fe-based catalysts for the reduction of oxygen in polymer electrolyte fuel cells," Electrochimica Acta 43(14-15), pp. 1969-1984 (1998).
Feinauer, et al., "Unlocking the Potential of Fluoride-Based Solid Electrolytes for Solid-State Lithium Batteries," ACS Applied Energy Materials 2(10), pp. 7196-7203 (2019).
George, "Fabrication and Properties of Nanolaminates Using Self-Limiting Surface Chemistry Techniques," University of Colorado Department of Chemistry and Biochemistry, ADA415471, 21 pages (2003).
George, "Atomic layer deposition: an overview," Chemical Reviews 110(1), pp. 111-131 (2010).
Hwang, et al., "NaF—FeF2 nanocomposite: New type of Na-ion battery cathode material," Nano Research 10, pp. 4388-4397 (2017).
International Search Report & Written Opinion for PCT/US2011/064593 dated Jul. 11, 2012, 10 pages.
Ivanov, et al., "Simulation of gain and timing resolution in saturated pores," Nuclear Instruments and Methods in Physics Research Section A: Accelerators, Spectrometers, Detectors and Associated Equipment 639(1), pp. 158-161 (2011).
Iwahori, et al., "Optical properties of fluoride thin films deposited by RF magnetron sputtering," Applied Optics 45(19), pp. 4598-4602 (2006).
Jaouen, et al., "Cross-Laboratory Experimental Study of Non-Noble-Metal Electrocatalysts for the Oxygen Reduction Reaction", Applied Materials and Interfaces 1(8), pp. 1623-1639 (2009).
Jokela, et al., "Secondary Electron Yield of Emissive Materials for Large-Area Micro-Channel Plate Detectors: Surface Composition and Film Thickness Dependencies," Physics Procedia 37, pp. 740-747 (2012).
Kim, et al., "Synthesis of Calcium(II) Amidinate Precursors for Atomic Layer Deposition through a Redox Reaction between Calcium and Amidines," Angewandte Chemie 55(35), pp. 10228-10233 (2016).
Knisley, et al., "Precursors and chemistry for the atomic layer deposition of metallic first row transition metal films," Coordination Chemistry Reviews 257(23-24), pp. 3222-3231 (2013).
Ledinek, et al., "Effect of NaF pre-cursor on alumina and hafnia rear contact passivation layers in ultra-thin Cu(In,Ga)Se2 solar cells," Thin Solid Films 683, pp. 156-164 (2019).
Lee & George, "Atomic Layer Etching of Al2O3 Using Sequential, Self-Limiting Thermal Reactions with Sn(acac)2 and Hydrogen Fluoride," ACS Nano 9(2), pp. 2061-2070 (2015).
Lee, et al., "Atomic Layer Deposition of Metal Fluorides Using HF-Pyridine as the Fluorine Precursor," Chemistry of Materials 28(7), pp. 2022-2032 (2016).
Lefevre & Dodelet, "Fe-based catyalysts for the reduction of oxygen in polymer electrolyte membrane fuel cell conditions: determination of the amount of peroxide released during electroreduction and its influence on the stablity of the catalysts", Electrochimica Acta 48(19), pp. 2749-2760 (2003).
Lefevre, et al., "Iron-Based Catalysts with Imporved Oxygen Reduction Activity in Polymer Electrolyte Fuel Cells", Science 324(5923), pp. 71-74 (2009).
Li, et al., "Cation and anion immobilization through chemical bonding enhancement with fluorides for stable halide perovskite solar cells," Nature Energy 4, pp. 408-415 (2019).
Lingg, et al., "Sodium fluoride thin films by chemical vapor deposition," Thin Solid Films 209(1), pp. 9-16 (1992).
Liu, et al., "Toward 3D Solid-State Batteries via Atomic Layer Deposition Approach," Frontiers in Energy Research 6, 10, 5 pages (2018).

(56) References Cited

OTHER PUBLICATIONS

Luo, et al., "Na-Ion Battery Anodes: Materials and Electrochemistry," Accounts of Chemical Research 49(2), pp. 231-240 (2016).

Ma, et al., "Atomic Layer Deposition for Lithium-Based Batteries," Advanced Materials Interfaces 3(21), 1600564, 15 pages (2016).

Ma, et al., "Cobalt Imidazolate Framework as Precursor for Oxygen Reduction Reaction Electroatalysts," Chemistry: A European Journal 17(7), pp. 2063-2067 (2011).

Mahuli, et al., "Atomic layer deposition of aluminum oxyfluoride thin films with tunable stoichiometry," Journal of Vacuum Science & Technology A 38:022407, 10 pages (2020).

Mahurin, et al., "Atomic Layer Deposition of $TiO_2$ on Mesoporous Silica," Journal of Non-Crystalline Solids 352(30-31), pp. 3280-3284 (2006).

Mane & Elam, "Atomic Layer Deposition of W:$Al_2O_3$ Nanocomposite Films with Tunable Resistivity," Chemical Vapor Deposition 19(4-6), pp. 186-193 (2013).

Mane & Elam, et al., "Nanostructured composite thin films with tailored resistivity by atomic layer deposition," Proceedings of SPIE 8818, 8 pages (2013).

Mane, et al., "A novel atomic layer deposition method to fabricate economical and robust large area microchannel plates for photodetectors," 2nd International Conference on Technology and Instrumentation in Particle Physics, retrieved from https://indico.cern.ch/event/102998/contributions/17033/attachments/10453, 28 pages (2011).

Mane, et al., "A novel atomic layer deposition method to fabricate economical and robust large area microchannel plates," Proceedings of SPIE 8031, 80312H, 7 pages (2011).

Mane, et al., "A novel atomic layer deposition method to fabricate economical and robust large area microchannel plates," SPIE Proceedings 8031, Micro- and Nanotechnology Sensors, Systems, and Applications III, 80312H, 7 pages (2011).

Mane, et al., "An Atomic Layer Deposition Method to Fabricate Economical and Robust Large Area Microchannel Plates for Photodetectors," Physics Procedia 37, pp. 722-732 (2012).

Mane, et al., "Atomic Layer Deposition of Nanostructured Tunable Resistance Coatings: Growth, Characterization, and Electrical Properties," ECS Transactions 64(9), pp. 3-14 (2014).

Mane, et al., "Creation of economical and robust large area MCPs by ALD method for photodetectors," Proceedings of SPIE 9968, 11 pages (2016).

Mantymaki, et al., "Metal Fluorides as Lithium-Ion Battery Materials: An Atomic Layer Deposition Perspective," Coatings 8(8), 277, 40 pages (2018).

Meng, et al., "Emerging Applications of Atomic Layer Deposition for Lithium-Ion Battery Studies," Advanced Materials 24(27), pp. 3589-3615 (2012).

Meng, et al., "SWCNT-Supported Amorphous Gallium Sulfide as a New High-Performance Anode for Lithium-Ion Batteries," 223rd Electrochemical Society Meeting, Abstract #388, 1 page (2013).

Minot, et al., "Pilot production and advanced development of large-area picosecond photodetectors," Proceedings of SPIE 9968, 14 pages (2016).

Mironova & Gradusova, "Measurements of the refractometric characteristics of optical materials in the 248-5000-nm spectral region," Journal of Optical Technology 79(2), pp. 112-115 (2012).

Necas & Klapetek, "Gwyddion: an open-source software for SPM data analysis," Open Physics 10(1), pp. 181-188 (2012).

Niskanen, et al., "Refractive index retrieval from transmittance measurements," Optik 127(14), pp. 5562-5567 (2016).

Oberla, et al., "A 4-Channel Waveform Sampling ASIC in 0.13 μm CMOS for front-end Readout of Large-Area Micro-Channel Plate Detectors," Physics Procedia 37, pp. 1690-1698 (2012).

Ostreng, et al., "Atomic layer deposition of sodium and potassium oxides: evaluation of precursors and deposition of thin films," Dalton Transactions 43, pp. 16666-16672 (2014).

Pham, et al., "Improved Hydrothermal Stability of Niobia-Supported Pd Catalysts," Applied Catalysis A: General 397(1-2), pp. 153-162, pp. 153-162 (2011).

Pilvi, et al., "Atomic layer deposition process with $TiF_4$ as a precursor for depositing metal fluoride thin films," Applied Optics 47(13), pp. C271-C274 (2008).

Pilvi, et al., "Novel ALD Process for Depositing $CaF_2$ Thin Films," Chemistry of Materials 19(14), pp. 3387-3392 (2007).

Pu, et al., "Recent Progress in Rechargeable Sodium-Ion Batteries: toward High-Power Applications," Small 15(32), 1805427, 33 pages (2019).

Putkonen, et al., "Atomic layer deposition of metal fluorides through oxide chemistry," Journal of Materials Chemistry 21(38), pp. 14461-14465 (2011).

Rajan, et al., "Impact of Post-Deposition Recrystallization by Alkali Fluorides on Cu(In,Ga)$Se_2$ Thin-Film Materials and Solar Cells," Thin Solid Films 690, 137526, 5 pages (2019).

Ritala, et al., "Rapid Coating of Through-Porous Substrates by Atomic Layer Deposition," Chemical Vapor Deposition 12(11), pp. 655-658 (2006).

Samuels, et al., "Chemical Vapor Deposition of Metal Fluorides Using Sodium and Zirconium Fluoroalkoxides," Chemistry of Materials 6(1), pp. 1684-1692 (1994).

Sang, et al., "Suppression in the electrical hysteresis by using $CaF_2$ dielectric layer for p-GaN MIS capacitors," Journal of Applied Physics 123, 161423 (2018).

Schroeder, et al., "Epitaxial growth of laminar crystalline silicon on $CaF_2$," Applied Physics Letters 77(9), 1289-1291 (2000).

Seh, et al., "A Highly Reversible Room-Temperature Sodium Metal Anode," ACS Central Science 1(8), pp. 449-455 (2015).

Shi, et al., "Structure and electrochemical performance of $CaF_2$ coated $LiMn_{1/3}Ni_{1/3}Co_{1/3}O_2$ cathode material for Li-ion batteries," Electrochimica Acta 83, pp. 105-112 (2012).

Siegmund, "Ultrafast Large Area Vacuum Detectors: Part I," Seminario Nazionale Rivelatori Innovativi, retrieved from https://agenda.infn.it/event/4542/contributions/53649/attachments/38415/, 37 pages (2012).

Siegmund, "Ultrafast Large Area Vacuum Detectors: Part II," Seminario Nazionale Rivelatori Innovativi, retrieved from https://agenda.infn.it/event/4542/contributions/53652/attachments/38399/, 43 pages (2012).

Siegmund, et al., "Advances in microchannel plates and photocathodes for ultraviolet photon counting detectors," SPIE Proceedings 8145, 81450J, 12 pages (2011).

Siegmund, et al., "Advances in Microchannel Plates for Sealed Tube Detectors," LIGHT 11: Workshop on the Latest Developments of Photon Detectors, retrieved from http://lappddocs.uchicago.edu/documents/201, 17 pages (2011).

Siegmund, et al., "Atomic Deposited Borosilicate Glass Microchannel Plates for Large Area Event Counting Detectors," 6th International Conference on New Developments in Photon Detection, retrieved from http://lappddocs.uchicago.edu/documents/199, 15 pages (2011).

Siegmund, et al., "Atomic layer deposited borosilicate glass microchannel plates for large area event counting detectors," Nuclear Instruments and Methods in Physics Research Section A: Accelerators, Spectrometers, Detectors and Associated Equipment 695, pp. 168-171 (2012).

Siegmund, et al., "Development of Large Area Photon Counting Detectors Optimized for Cherenkov Light Imaging with High Temporal and sub-mm Spatial Resolution," 2011 IEEE Nuclear Science Symposium Conference Record, retrieved from http://lappddocs.uchicago.edu/documents/202, 8 pages (2011).

Siegmund, et al., "Large Area Photodetector Development Project at Space Sciences Laboratory (SSL)," SLAC National Accelerator Laboratory, retrieved from http://lappddocs.uchicago.edu/documents/195, 28 pages (2009).

Siegmund, et al., Microchannel plate detector technology potential for LUVOIR and HabEx, Proceedings of SPIE 10397, 14 pages (2017).

Sonsteby, et al., "Atomic layer deposition of (K,Na)(Nb, Ta)$O_3$ thin films," Journal of Vacuum Science & Technology A 34, 041508, 7 pages (2016).

Sonsteby, et al., "Chemical Uniformity in Ferroelectric $K_xNa_{1-x}NbO_3$ Thin Films," Global Challenges 3(10), 1800114, 6 pages (2019).

(56) References Cited

OTHER PUBLICATIONS

Sonsteby, et al., "tert-butoxides as precursors for atomic layer deposition of alkali metal containing thin films," Journal of Vacuum Science & Technology A 38, 060804, 15 pages (2020).

Sumiya, et al., "Initial growth stages of CaF2 on Si(111) investigated by scanning tunneling microscopy," Applied Surface Science 156(1-4), pp. 85-96 (2000).

Tong, et al., "Nanoclusters of MoO3-x embedded in an Al2O3 matrix engineered for customizable mesoscale resistivity and high dielectric strength," Applied Physics Letters 102, 252901, 5 pages (2013).

Wagner, "Development of a Lower Cost Large Area Microchannel Plate Photodetector," Workshop on the Latest Developments of Photon Detectors, retrieved from http://lappddocs.uchicago.edu/documents/205, 25 pages (2011).

Walter, et al., "Challenges and benefits of post-lithium-ion batteries," New Journal of Chemistry 44, pp. 167-1683 (2020).

Wetstein, et al., "Systems-Level Characterization of Microchannel Plate Detector Assemblies, using a Pulsed sub-Picosecond Laser," Physics Procedia 37, pp. 748-756 (2012).

Wind, et al., "Nucleation period, surface roughness, and oscillations in mass gain per cycle during W atomic layer deposition on Al2O3," Journal of Applied Physics 105, 074309, 13 pages (2009).

Wu, et al., "Guidelines and trends for next-generation rechargeable lithium and lithium-ion batteries," Chemical Society Reviews 49(5), pp. 1569-1614 (2020).

Wu, et al., "High-Performance Electrocatalysts for Oxygen Reduction Derived from Polyaniline, Iron, and Cobalt," Science 332(6028), pp. 443-447 (2011).

Ylilammi & Ranta-Aho, "Metal Fluoride Thin Films Prepared by Atomic Layer Deposition," Journal of the Electrochemical Society 141(5), pp. 1278-1284 (1994).

Yu, et al., "Electrode Engineering by Atomic Layer Deposition for Sodium-Ion Batteries: From Traditional to Advanced Batteries," Advanced Functional Materials 30(9), 1906890, 28 pages (2020).

Zhao, et al., "Addressing Interfacial Issues in Liquid-Based and Solid-State Batteries by Atomic and Molecular Layer Deposition," Joule 2(12), pp. 2583-2604 (2018).

Zuo, et al., "Recent progress in surface coating of cathode materials for lithium ion secondary batteries," Journal of Alloys and Compounds 706, pp. 24-40 (2017) (68 page accepted manuscript provided).

\* cited by examiner

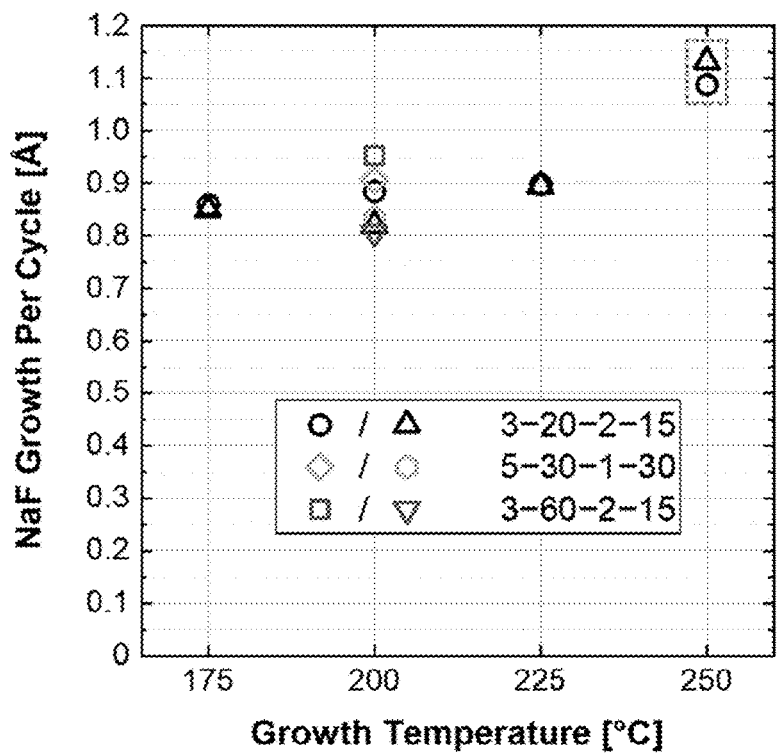
FIG. 4
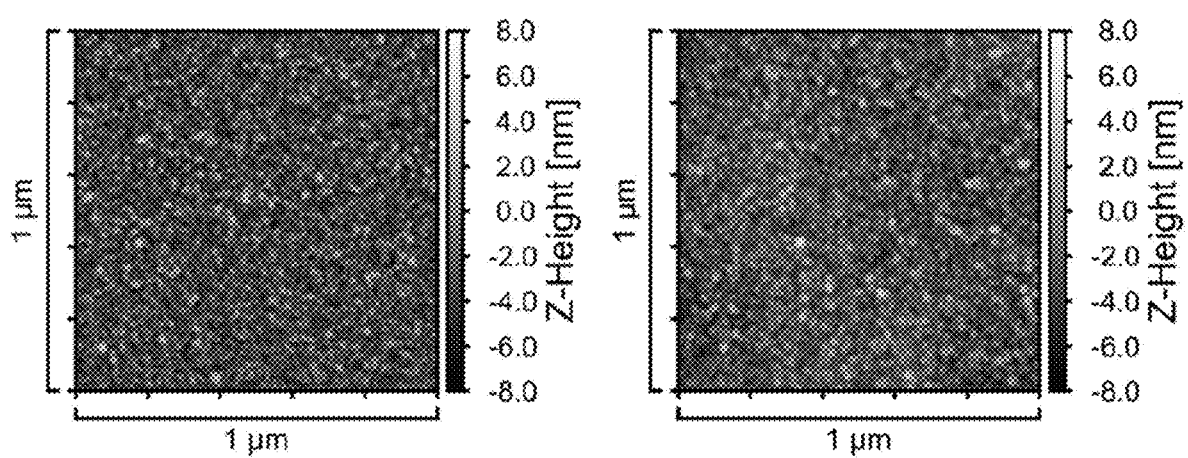
FIG. 5A
FIG. 5B

METHOD OF MAKING THIN FILMS OF SODIUM FLUORIDES AND THEIR DERIVATIVES BY ALD

This invention was made with government support under Contract No. DE-AC02-06CH11357 awarded by the United States Department of Energy to UChicago Argonne, LLC, operator of Argonne National Laboratory and under Department of Energy Award No. DE-SC0019121. The government has certain rights in the invention.

TECHNICAL FIELD

The present disclosure relates generally to a method of making thin films of sodium fluorides and their derivatives by atomic layer deposition ("ALD").

BACKGROUND

The need for advanced energy conversion and storage devices remains a critical challenge amid the growing worldwide demand for renewable energy. Metal fluoride thin films are of great interest for applications in lithium-ion and emerging rechargeable battery technologies, particularly for enhancing the stability of the electrode-electrolyte interface and thereby extending battery cyclability and lifetime. Metal fluorides are one class of materials being explored for advanced battery applications, and have demonstrated promising results as both electrodes and solid electrolytes.

Lithium thin films have been the predominate model for energy storage devices. However, lithium is both a relatively rare element on earth as well as typically requires expensive and environmentally harmful mining techniques to extract. There is a desire for alternative metal fluoride films. While sodium is abundant and can provide similar desirable attributes to lithium fluoride, methods for forming sodium fluoride thin films are necessary to achieve the same utility as demonstrated for lithium fluoride thin films. Use of sodium fluoride in place of lithium fluoride, such as in batteries, is therefore expected to be relatively low cost and more environmentally friendly than current Lithium Ion Batteries (LIBs).

While LIB are well known and characterized, Sodium Ion Batteries (SIBs), are, perhaps, not as well understood. However, SIBs generally operate on the same fundamental principles as LIBs, so they also experience many of the same problems, such as limited theoretical energy density, structural instability of anode/cathode materials, dendrite formation, and short cycle life. Significant progress has been made towards overcoming these challenges through concentrated research in LIBs, and similar approaches are being explored in the continued development of SIBs. In particular, control over the electrolyte interfaces—both solid electrolyte interphase ("SEI") layers at the anode and cathode-electrolyte interface ("CEI")—is a key to improving battery performance and stability. In a common approach, ultra-thin layer coatings are introduced to form stable, ion-conductive interfaces between the electrolyte and the electrodes. However, the ability to form sodium fluoride thin films is a limitation on the development and use of SIBs.

SUMMARY

Embodiments described herein relate generally to a method for deposition sodium fluoride. The method includes providing a substrate and performing an atomic layer deposition. The atomic layer depositions comprises a first half reaction exposing a sodium precursor to the substrate at a first half reaction temperature, forming a sodium intermediate. The atomic layer deposition further comprises a second half reaction exposing a fluorine precursor to the sodium intermediate. The sodium intermediate is reacted with the fluorine precursor forming a sodium fluoride coating on the substrate. In one embodiment the sodium precursor is tert-butoxide and the fluorine precursor is selected from the group consisting of sulfur tetrafluoride, ammonium fluoride, $WF_6$, and/or Hf-pyridine.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are not, therefore, to be considered limiting of its scope, the disclosure will be described with additional specificity and detail through use of the accompanying drawings.

FIG. 3A shows a survey scan, FIG. 3B shows a sodium 1s region, and FIG. 3C shows a fluorine 1s region.

FIG. 4 shows temperature dependence of NaF GPC, based on SE fitting results for 100 ALD cycles of NaO$^t$Bu+HF-pyridine on silicon substrates. Duplicate samples from different regions of the reactor chamber are shown for each growth temperature. Calculated errors of the fitted thickness values are within the data markers. Films deposited at 250° C. (dotted rectangle) deviated slightly from the bulk NaF Sellmeier SE model.

FIGS. 5A-5D show argon-filled glovebox AFM images of NaF surface morphology for as-deposited films on silicon substrates at growth temperatures of 175° C., 200° C., 225° C., and 250° C.

Figure 1A:
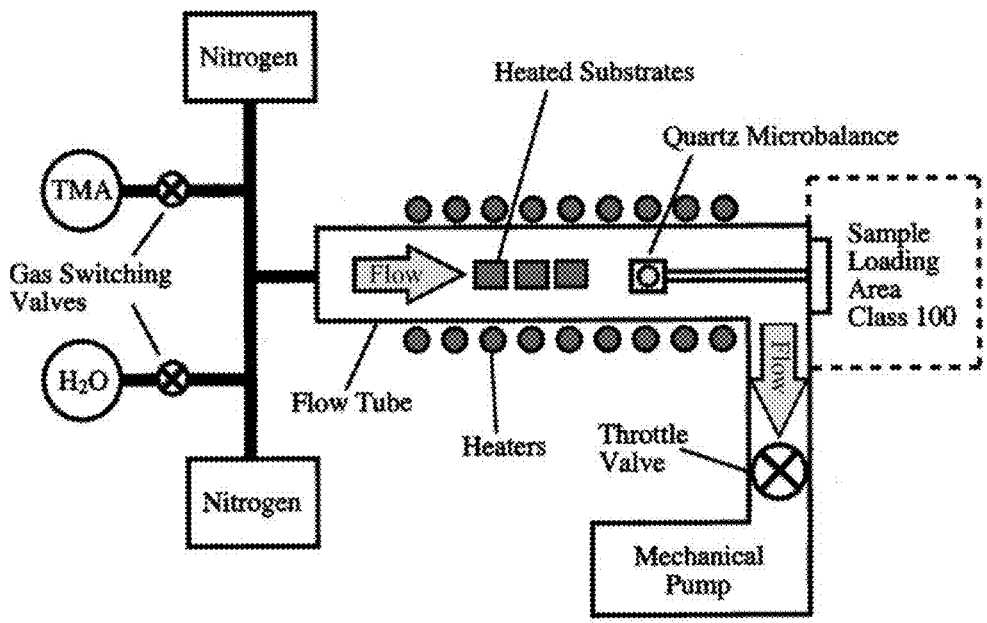
FIGS. 1A-1C are an illustration of one embodiment of an ALD process for NaF using NaOtBu and HF-pyridine solution. Pyridine is not included in the schematic because it does not participate in the ALD surface reactions. The ALD cycle consists of four steps, each defined by a corresponding step time 1) NaOtBu dose, 2) purge, 3) HF-pyridine dose, 4) purge. Temporal separation of the precursor doses ensures that reactions occur only at the substrate surface (not in the vapor phase), and ultimate film thickness is therefore determined by the number of NaOtBu+HF-pyridine cycles completed.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

While sodium fluoride thin films are a desirable substitute for lithium fluoride thin films, a process for developing such films is needed. Sodium fluoride (NaF) has shown utility in SIB applications as a cathode constituent material and as a solid-electrolyte interface layer on sodium metal anodes. NaF films have been deposited via CVD, as well as sputtering and spin coating for use in solar cells. All of these deposition methods lack the conformity and sub-nanometer-level precision of ALD, and although ALD has been used in the synthesis of many metal fluorides, no such process has been reported for ALD of NaF.

One embodiment described herein relates to a method of making thin films of sodium fluorides and their derivatives by atomic layer deposition ("ALD"). In its simplest form, ALD is a two-step process consisting of half-cycles. In a first half-cycle, a first precursor binds to the surface of the substrate (adsorption), and the excess first precursor, along with the byproducts formed, are then purged in the next step. In a second half-cycle, a second precursor (or co-reactant) is added to react with the adsorbed/bound intermediate entity formed by the first precursor. The excess second precursor and byproducts are then purged out, completing the full ALD cycle. The reaction of the second precursor with the first adsorbed entity forms a deposited material.

ALD has been recognized as a promising method to deposit thin film electrode coatings, which must be pinhole-free in order to form stable interfaces. ALD is a deposition technique that enables conformal coating of complex substrates with sub-nanometer thickness control. ALD utilizes cyclic self-limiting surface reactions of alternating doses of chemical precursor vapors that react with a substrate surface to form a thin film.

In one embodiment, the general ALD process includes a substrate that is reacted with a first precursor in the first half reaction to form a first intermediate entity having a metal from the first precursor. In a second half reaction, a second precursor, such as a reducing agent, is exposed to the first intermediate entity and reacted to form a fluoride film, such as a sodium fluoride. FIG. 1 illustrates one embodiment of such a process. Some embodiments relate to the formation of a sodium fluoride materials. Some embodiments relate to a process for forming a sodium fluoride material by ALD deposition through supercycle of a first reaction between a sodium precursor and an oxidant and second reaction between a fluoride precursor and an oxidant, where the first and second reaction may be in equal cycles or unequal cycles.

The ALD occurs with a substrate serving as the initial deposition surface. The substrate may include but are not limited to Si (100), quartz, aluminum (II) oxide, ALO, carbon nanotubes, cathodes, and silicon oxide. The ALD process includes a first half cycle deposition reaction using a sodium precursor and a second half cycle deposition reacting using a fluorine precursor. The sodium precursor may be, for example, sodium tert-butoxide (NaO$^t$Bu or $(CH_3)_3CONa$). The first reactant, e.g. the sodium precursor, reacts to form a sodium intermediate, such as $Na(O^tBu)_{1-x}$. The ALD process includes a second reactant, e.g., the fluorine precursor. The fluorine precursor may comprise sulfur tetrafluoride, ammonium fluoride, $WF_6$, and/or Hf-pyridine.

As an example, in one embodiment it is believed that the following half-reactions of NaF ALD:

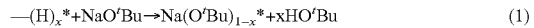

$$—(H)_x^* + NaO^tBu \rightarrow Na(O^tBu)_{1-x}^* + xHO^tBu \qquad (1)$$

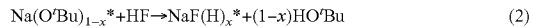

$$Na(O^tBu)_{1-x}^* + HF \rightarrow NaF(H)_x^* + (1-x)HO^tBu \qquad (2)$$

where asterisks denote surface species. Defining R as the ratio between $\Delta m_{NaOtBu}$ and $\Delta m_{Net}$ for the 3-20-2-15 cycle timing:

$$R = \Delta m_{NaOtBu}/\Delta m_{Net} = 1.8 \qquad (3)$$

This ratio can also be expressed in terms of the atomic weights of the species in Eqs. 1-2:

$$R = [73(1-x) + 23 - x]/42 \qquad (4)$$

Solving for x from Eqs. 3-4 yields x=0.26, indicating an average of 26% of the tert-butoxide ligands were removed as tert-butanol during the NaO$^t$Bu half-cycle, while 74% were removed during the HF-pyridine half-cycle using the 3-20-2-15 cycle timing. For the 3-60-2-20 cycle timing, 67% and 33% were removed in the NaO$^t$Bu and HF-pyridine half-cycles, respectively. The polymeric nature of the NaO$^t$Bu compound may lead to mass changes associated with the adsorption and desorption of intact NaO$^t$Bu molecules and clusters that do not contribute to the ALD chemistry in Eqs. 1-2 and complicate interpretation of the QCM data.

In one embodiment, each ALD process consists of a cycle, which may be repeated to form desired thickness of film. A cycle consists of a sodium precursor pulse for an exposure followed by a purge, such as where the reactor is pumped to a vacuum, followed by a fluoride precursor pulse by a purge. It should be appreciated that the dose and purge time is based on the self-limiting behavior of the precursors. This can be varied in a wide range from a few milliseconds to tens of seconds. Further if a longer dose than purge time is utilized, the times may need to increase to avoid a chemical vapor deposition ("CVD") type reaction, which can result in non-uniformity and particles formation.

It should be appreciated that more complicated ALD schemes can be constructed as a super-cycle comprising various sub-cycles for depositing a material as described or for depositing multiple different materials as layer. Further, additional cycle(s) for deposition of dopants or other constitutes may be deposited as well in accordance with compatible chemistries of the accompany deposition, preferable ALD and using reactants in the same ALD reactor.

In some embodiments, the respective pulse and exposures may be the same time (pulse persists through the exposure) or pulse may be for a shorter time than the overall exposure (pulse ceases but exposure continues).

In some embodiments, the substrate can be heated to a predetermined temperature during the ALD process. For example, the first predetermined temperature can be in the range of 150-250° C. (e.g., 150, 160, 170, 180, 190, 200, 210, 220, 230, 240, and 250° C., inclusive of all ranges and values therebetween). In some embodiments, the first predetermined temperature is in the range of 175-250° C. (e.g., 200° C.). Temperature also impacts the overall energy in the system and the performance for diffusion and/or reaction. In an ALD process, the deposition temperature range where more or less same growth as function of growth occurs is referred to as the "ALD window." The ALD reaction should occur at a temperature of the precursor which sufficient to give constant precursor's evaporation rate (i.e., vapor pressure). If vapor pressure is not enough, there may still be layer growth, but the surface coverage will be poor. If vapor pressure is too much, it will waste precursor, and there may be CVD growth if there is not sufficient purge time due to mixing of precursors. The temperature of the layer growth can be as low as subliming temperature of the ALD precursors. For example if precursor sublimes at 150° C. films can also grow around that temperature. But generally layer growth temperature is 25-50° C. higher than precursor sublimation temperature, such as at least 175° C. for precursors described for some embodiments. Further, in some embodiments, plasma can be used to enhance growth rate/tailor the composition of the deposited layer.

In some embodiments, the sodium precursor is a vapor and the sodium precursor pulse comprises input to the reactor of a sodium precursor vapor for a sodium precursor pulse time of a few milliseconds to 10 s of seconds (e.g., 0.5, 1, 2, 3, 4, 5, 6, 7, 8, 9, and 10 seconds, inclusive of all ranges and values therebetween). The first partial pressure of can be in the range of 0.01-1000 Torr (e.g., 10, 25, 50, 75, 100, 500, or 1000 Torr, inclusive of all ranges and values therebetween), such as, in one embodiment, 0.5-100 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. Note, for ease of reference herein, the process is described with regard to the pulse duration, but it should be understood that the precursor partial pressure is what dictates the diffusion boundary conditions. A carrier gas, such as argon or other non-reactive (with the substrate or the precursors) gas, may be used.

In some embodiments, the sodium precursor exposure comprises exposing the substrate to the sodium precursor for a first exposure time and a first partial pressure of the sodium precursor so that the sodium precursor binds with the substrate or a coating from prior ALD cycles on the substrate. In some embodiments, given the short time for the pulse/exposure for the ALD process the pulse lasts the entire exposure until the purge starts with the pulse time and exposure time being the same. The sodium precursor pulse time may be less than the first exposure time, or they may be equal such that the exposure is the same as the pulse. The first exposure time can be in the range of 0.5-20 seconds (e.g., 0.5, 1, 2, 3, 4, 5, 6, 7, 8, 9, 10, 15, and 20 seconds, inclusive of all ranges and values there between). In some embodiments, the first predetermined time is in the range of 1-10 seconds.

The sodium precursor purge evacuates unreacted precursor from the reactor. The sodium precursor purge may be for a sodium precursor purge time of 0.5-30 seconds (e.g., 0.5, 1, 5, 10, 20, or 30 seconds, inclusive of all ranges and values there between), such as 20 seconds by exposure to nitrogen purge gas. The sodium precursor purge reduces the pressure in the reactor to within the range of 0.01-10 Torr (e.g., 0.01, 0.05, 0.1, 0.5, 1.0, 5.0, or 10 Torr, inclusive of all ranges and values there between), such as substantially to vacuum. Where a purge gas is utilized, the purge gas may be nitrogen such as 300 sccm.

In some embodiments, exposing the substrate to first fluorine precursor for a first fluorine precursor exposure time and a second partial pressure of the first fluorine precursor so that first fluorine precursor reacts with the entity formed by the sodium precursor reacting with the substrate (or previous ALD deposited coatings). The first fluorine precursor exposure time can be in the range of 0.5-500 seconds (e.g., 0.5, 1, 2, 3, 4, 5, 6, 7, 8, 9, and 10 seconds, inclusive of all ranges and values there between), such as about 1 second. The second partial pressure of the first fluorine precursor can be in the range of 0.01-10 Torr (e.g., 0.01, 0.05, 0.1, 0.5, 1.0, 5.0, or 10 Torr, inclusive of all ranges and values there between). In some embodiments, the second partial pressure of the first fluorine precursor is in the range of 0.1-1 Torr (e.g., about 0.5 Torr) such as 0.88 Torr.

The first fluorine precursor purge evacuates unreacted precursor from the reactor. The first fluorine precursor purge may be for a first fluorine precursor purge time of 0.5-20 seconds (0.5, 1, 2, 3, 4, 5, 6, 7, 8, 9, 10, 15, and 20 seconds, inclusive of all ranges and values there between), such as 15 seconds. The first fluorine precursor purge reduces the pressure in the reactor to within the range of 0.01-10 Torr (e.g., 0.01, 0.05, 0.1, 0.5, 1.0, 5.0, or 10 Torr, inclusive of all ranges and values there between), such as substantially to vacuum. Where a purge gas is utilized, the purge gas may be nitrogen such as 300 sccm.

Any number of cycles of the first reaction depositing sodium fluoride. In some embodiments, the number of cycles of the ALD process can be in the range of 1-50 cycles (e.g., 1 cycle, 2, 3, 4, 5, 10, 15, 20, 25, 30, 35, 40, 45, or 50 cycles, inclusive of all ranges and values there between). In one embodiment, an ALD cycle of sodium tert-butoxide (NaOtBu): $N_2$ purge:HF-pyridine solution: $N_2$ purge: consists of 3-20-2-15 timing (in seconds).

Figure 1B:
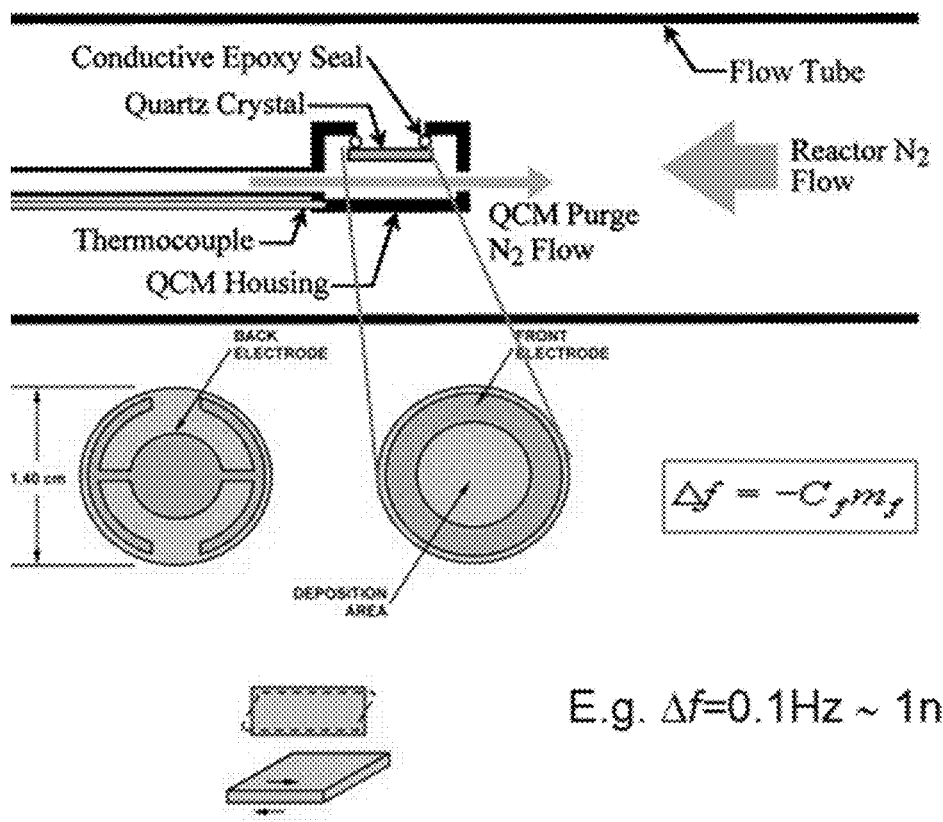
Figure 1C:
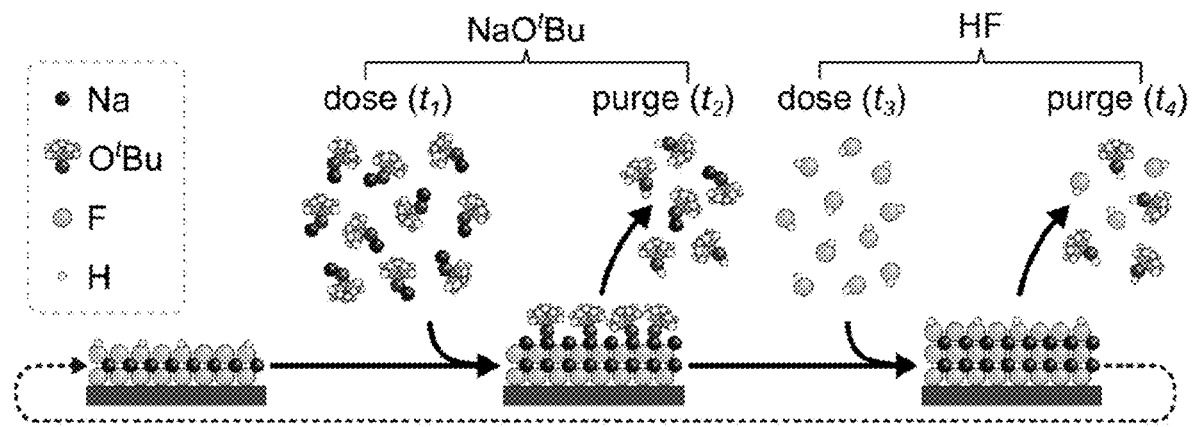

In one embodiment, illustrated in FIG. 1C, the synthesis of NaF thin films is accomplished via ALD using sodium tert-butoxide (NaO$^t$Bu) and HF-pyridine solution through the process illustrated in FIG. 1.

FIG. 1A illustrates a general ALD flow reactor for use in an embodiment of sodium fluoride thin layer deposition. FIG. 1B illustrates a ALD reactor setup for deposition of sodium fluoride thin layers on an electrode.

Experiments.

FIG. 1A illustrates a general ALD flow reactor for use in an embodiment of sodium fluoride thin layer deposition. FIG. 1B illustrates a ALD reactor setup for deposition of sodium fluoride thin layers on an electrode.

As described further, sodium fluoride (NaF) thin films were synthesized via ALD. NaF growth experiments were carried out at reactor temperatures between 175 and 250° C. using sodium tert-butoxide and HF-pyridine solution. The optimal deposition temperature range was 175-200° C., and the resulting NaF films exhibited low roughness (Rq≈1.6 nm), nearly stoichiometric composition (Na:F=1:1.05), and a growth per cycle value of 0.85 Å/cycle on SiO2 substrates. In situ process characterization with a quartz crystal microbalance ("QCM") was utilized to establish process parameters for self-limiting surface chemistry. For ex situ film characterization, NaF films were deposited on Si(100) coupons terminated with a native oxide layer (~20 Å). Films were characterized using X-ray photoelectron spectroscopy ("XPS"), spectroscopic ellipsometry ("SE"), atomic force microscopy ("AFM"), and scanning electron microscopy ("SEM").

NaF Deposition.

ALD was performed in a custom-built viscous flow reactor attached to an argon-filled glove box. The argon-filled glove box was used to prevent the hygroscopic NaF from absorbing atmospheric $H_2O$ vapor which might change the properties of the films. The process was controlled and monitored using custom LabVIEW software. The reaction chamber—a 4.76 cm diameter stainless steel tube—was heated to 200° C. and was maintained at ~1 Torr internal pressure with 270 sccm flow of ultra-high purity argon carrier gas (99.999% Ar). A subset of experiments was also performed at temperatures of 175° C., 225° C., and 250° C. to explore the temperature dependence of the ALD process. ALD experiments below a growth temperature of 175° C. were not attempted to avoid condensation of the NaO$^t$Bu compound. NaO$^t$Bu (97% purity, Sigma-Aldrich) is a white, crystalline powder with a melting point of 180° C. that adopts a hexamer structure and has a vapor pressure of 0.75 Torr at 140° C. The NaO$^t$Bu was contained in a custom-machined stainless-steel bubbler and heated to 130-140° C. bottom-of-pot temperature. NaO$^t$Bu was delivered to the reaction chamber by diverting 45 sccm Ar through the bubbler during each dose. HF-pyridine (~70% HF, ~30% pyridine, Sigma-Aldrich) was contained in an unheated stainless-steel cylinder (Swagelok). The NaF ALD cycle is defined by the NaO$^t$Bu dose time ($t_1$) and purge time ($t_2$), as well as the HFpyridine dose time ($t_3$) and purge time ($t_4$), with the overall cycle timing denoted $t_1$-$t_2$-$t_3$-$t_4$. Although a range of dose and purge times were explored for both precursors, typical values were 3-20-2-15, where each time is measured in seconds.

A similar process was utilized for an ALD deposition using $WF_6$ is the fluoride precursor. Si and ALO were utilized as substrates and 50 cycles of ALD were performed at a deposition temperature of 175 C.

Characterization.

In situ quartz crystal microbalance ("QCM") measurements were performed using a welded ALD sensor head (Inficon) with a 6 MHz RC-cut quartz crystal (Phillip Technologies). To minimize film deposition on the back side of the crystal, the sensor head was continually purged with Ar gas to bring the total chamber pressure up to ~1.1 Torr. The QCM was brought to thermal equilibrium in the reaction chamber over several hours, and the crystal was coated with ALD alumina ($Al_2O_3$) using alternating cycles of trimethyl aluminum and $H_2O$ prior to each NaF deposition to prepare a well-defined starting surface for the NaF ALD. Frequency shifts due to film deposition were measured with an STM-2 Thin Film Rate/Thickness Monitor (Inficon). Mass changes per unit area were calculated according to the Sauerbrey equation, as output by the STM-2 LabVIEW library supplied by Inficon.

For ex situ characterization, 100 ALD cycles of NaF were performed on Si(100) with ~20 Å native oxide (West Coast Silicon). To minimize air exposure prior to characterization, NaF-coated samples were stored under argon inside the reactor-attached glove box or in mylar bags heat-sealed inside of the glove box.

XPS measurements were performed on a Thermo Scientific K-Alpha XPS system operating in standard lens mode. The X-ray source was Al Kα with a spot size of 400 μm. Survey scans used a pass energy of 200.0 eV and step size of 1.000 eV, while high-resolution scans used a pass energy of 50.0 eV and step size of 0.100 eV. Five scans were averaged for each sample. The XPS data were analyzed using Thermo Scientific Avantage software, and all spectra were referenced to the adventitious C1s peak (284.8 eV).

SE was used to determine film thickness. Measurements were performed on a J. A. Woollam alpha-SE ellipsometer with CompleteEASE 5.1 software. Data were collected in standard acquisition mode with a single scan at an incidence angle of 70.094° at 188 wavelength increments from 380-900 nm. The thickness of the native oxide layer (20.06 Å) was measured prior to NaF deposition, and the thickness of the deposited NaF layer was fit with a NaF Sellmeier model for bulk NaF provided in the material library of the CompleteEASE software.

AFM images of NaF surfaces were obtained on Bruker Dimension FastScan AFMs equipped with Nanoscope V Controllers operating in peak-force tapping mode using ScanAsyst-Air-HR probes. As-deposited samples were stored in Ar and transferred in an Ar-filled vessel to an AFM housed in an Ar-filled MBraun3-glove glovebox. Additional air-exposed samples were removed from the Ar storage environment and imaged in ambient conditions after ~30 min of air exposure. AFM images were processed with Gwyddion 2.56. Prior to RMS roughness calculations, AFM images were leveled with a mean plane subtraction and row alignment (median subtraction) to remove scan line artifacts.

SEM was performed on an FEI Teneo FESEM using an in-column secondary electron detector (accelerating voltage=1.00 kV, aperture=32 μm, working distance=2.0 mm). Samples were stored in Ar and transported in an Ar-filled vessel before undergoing brief air exposure while being transferred into the SEM chamber.

Results and Discussion.

In situ QCM was used to establish precursor dose and purge times, and to examine steady-state growth behavior of the NaO$^t$Bu+HF-pyridine ALD chemistry. Steady-state growth for typical cycle timing of 3-20-2-15 at 200° C. is shown in FIG. 2A, with two cycles shown in detail in FIG. 2B.

Figure 2A:
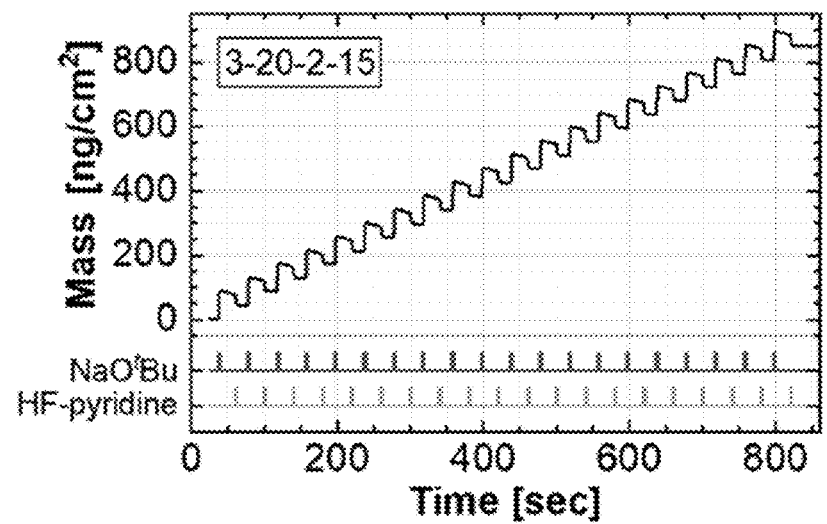
FIGS. 2A-2C show QCM data for steady-state NaF growth with 3-20-2-15 cycle timing (FIG. 2A), a detailed view of two cycles with 3-20-2-15 cycle timing (FIG. 2B), and a detailed view of two cycles with 3-60-2-20 cycle timing (FIG. 2C). The x- and y-scale values have been shifted so that both start at zero for the graphed data, though additional NaF cycles were completed prior those shown (in the case of FIG. 2A, 39 cycles were completed prior to the steady state cycles shown). All QCM measurements were performed at 200° C. and normalized to QCM of alumina (trimethylaluminum+water) to correct for any back-side deposition on the QCM crystal.

For the last 15 ALD cycles shown in FIG. 2A (3-20-2-15 cycle timing), the NaO$^t$Bu half-cycle yielded an average mass change of $\Delta m_{NaO^tBu}$=78 ng/cm$^2$ (std. dev.=0.2 ng/cm$^2$), while the HF-pyridine half-cycle yielded a mass change of $\Delta m_{HF}$=−35 ng/cm$^2$ (std. dev.=0.1 ng/cm$^2$). The average mass change for a complete ALD cycle was $\Delta m_{Net}$=42 ng/cm$^2$ (std. dev.=0.02 ng/cm$^2$). Assuming an upper bound film density of $\rho_{film}$=2.56 g/cm$^3$ for bulk crystalline NaF, the expected thickness change can be calculated using $\rho_{film}$=$\Delta m_{cycle}$/$\Delta t_{cycle}$, to be $\Delta t_{cycle}$≤1.7 Å/cycle.

Figure 2B:
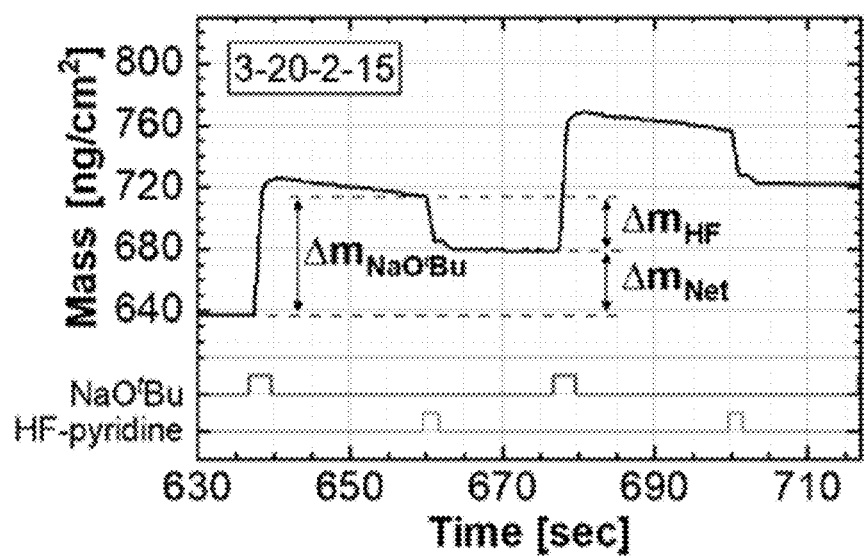
Figure 2C:
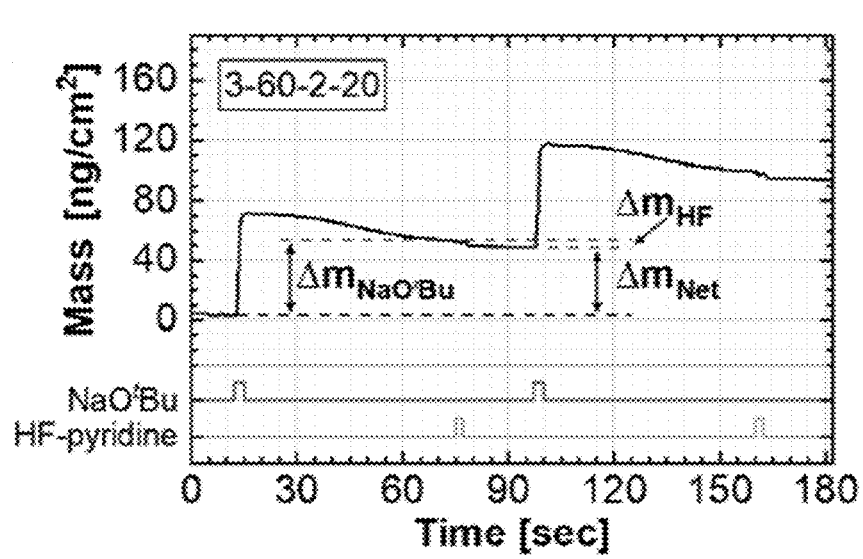
Figure 3A:
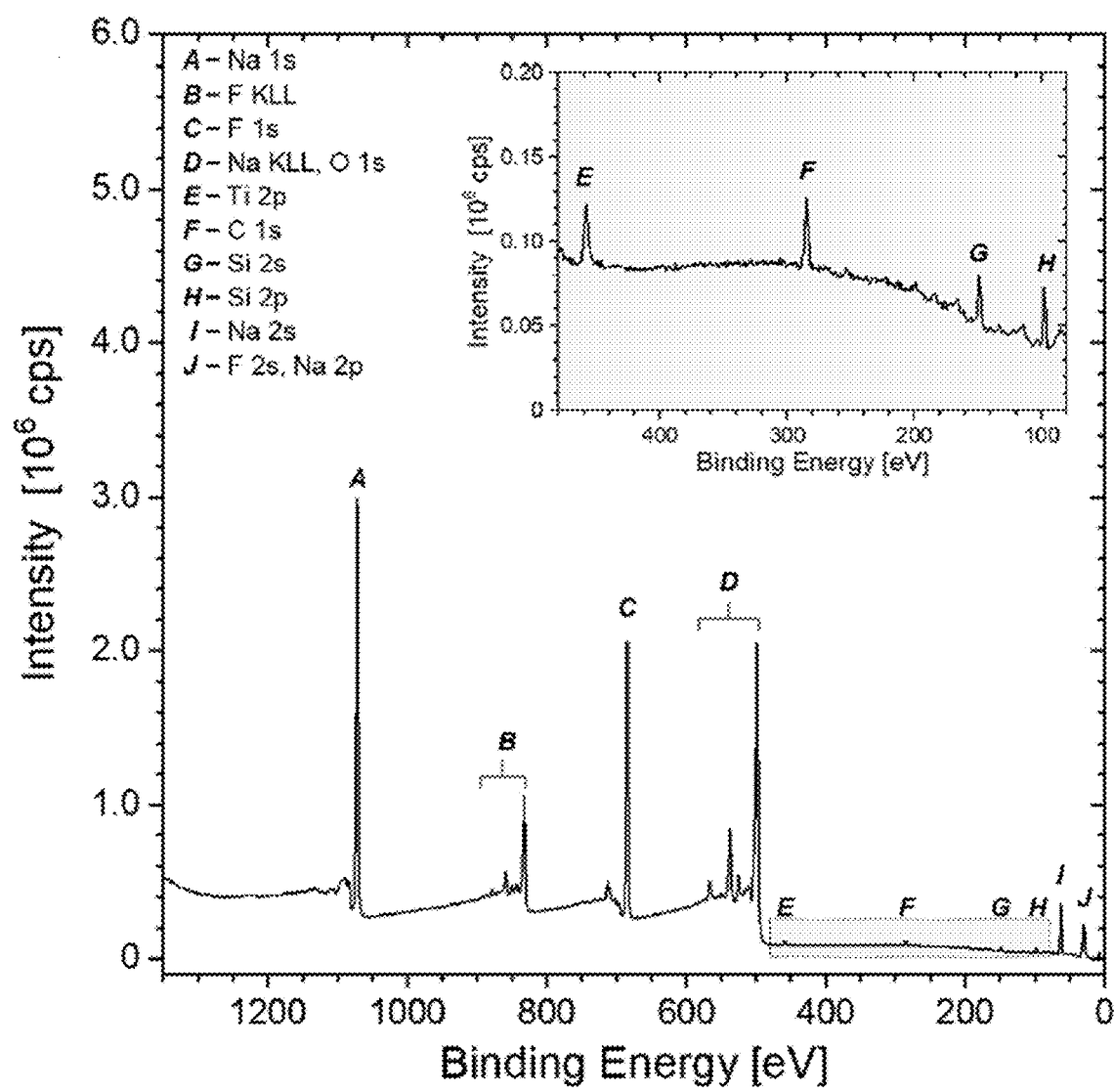
FIGS. 3A-3C show XPS data and analysis results for NaF film on silicon substrates. Deposition was performed at 200° C. with 100 ALD cycles of NaO$^t$Bu+HF-pyridine using 3-20-2-15 cycle timing.
Figure 3B:
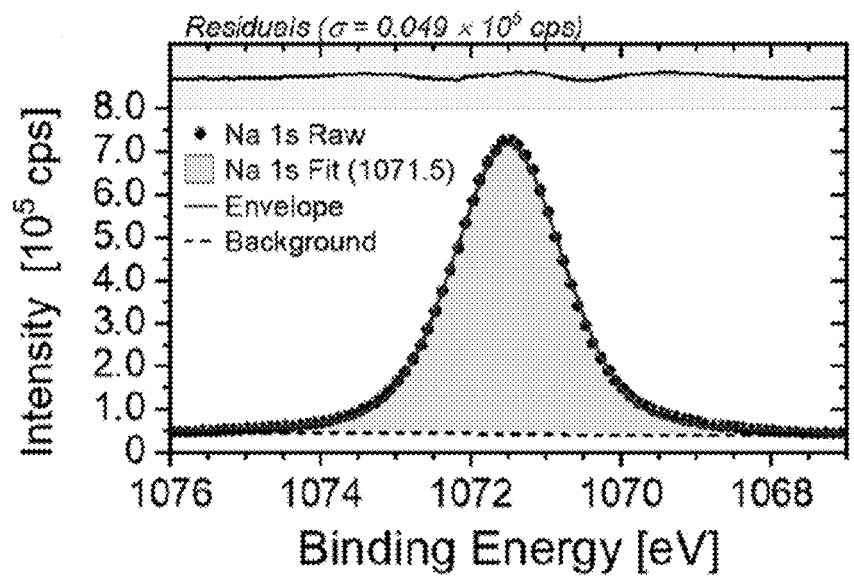
Figure 3C:
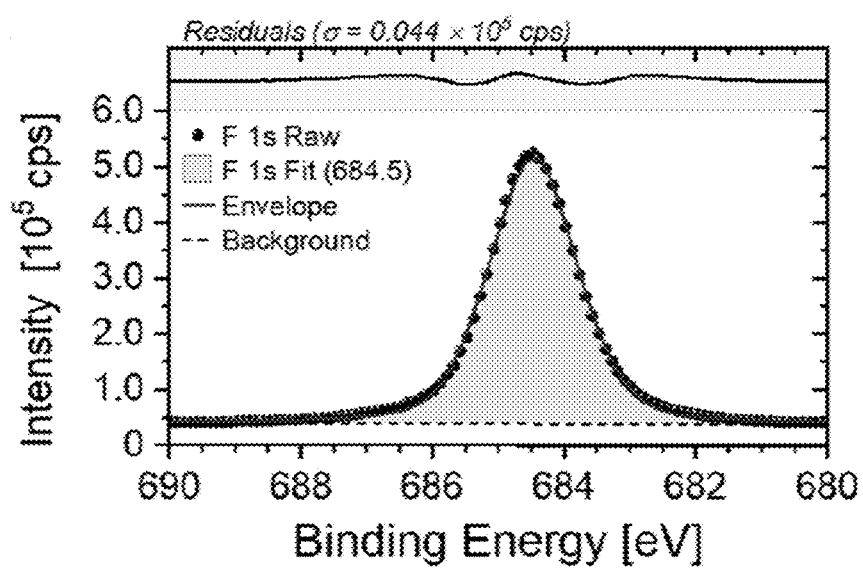
Figure 3D:
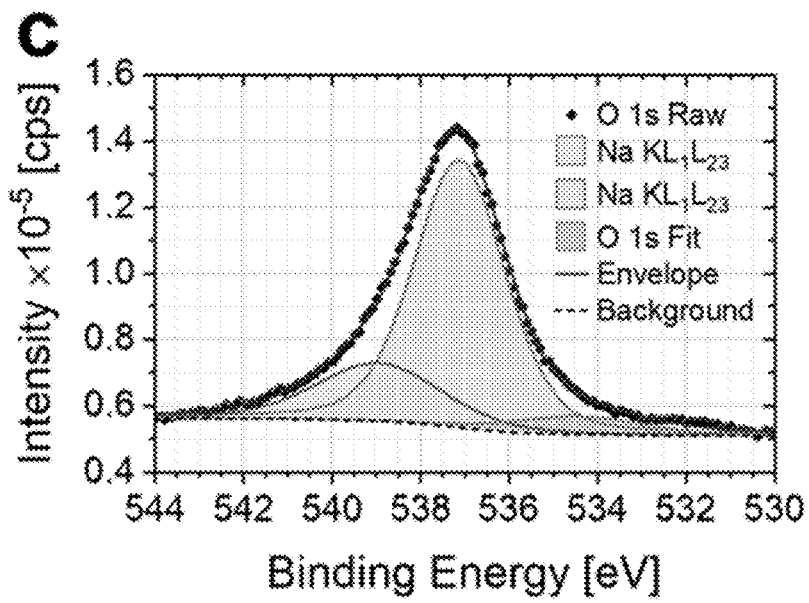
FIG. 3D shows XPS data for sodium.
Figure 3E:
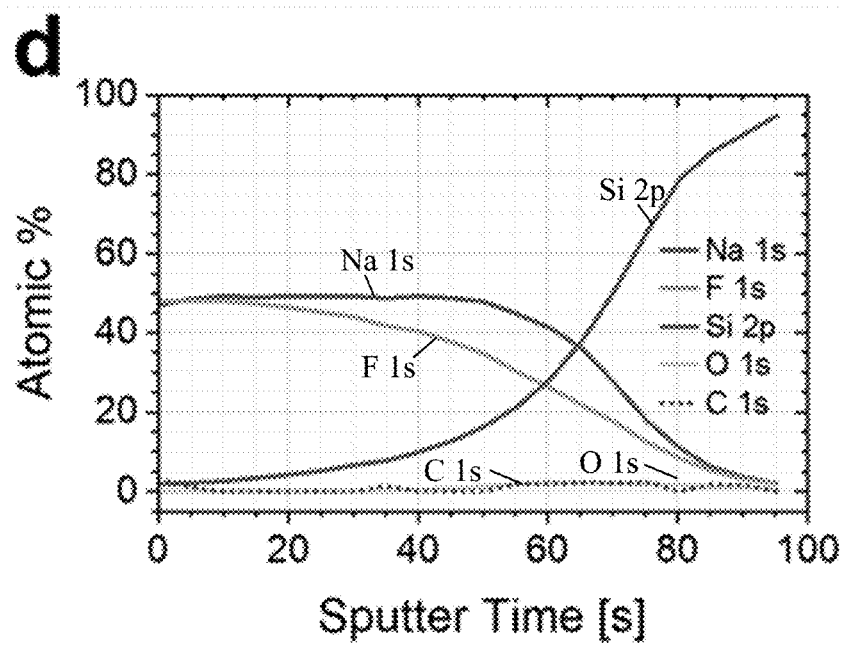
FIG. 3E shows atomic percent as a factor of sputter time for the constituent elements.

Two cycles of 3-60-2-20 are shown in FIG. 2C, illustrating markedly different mass change trends compared to FIGS. 2A-2B. The initial mass gain from the NaO$^t$Bu dose was smaller and some mass was subsequently lost during the prolonged purge ($\Delta m_{NaOtBu} \approx 50$ ng/cm$^2$), and the HF-pyridine dose yielded relatively little mass change ($\Delta m_{HF} \approx -5$ ng/cm$^2$). Interestingly, the net mass change for a complete ALD cycle remained similar ($\Delta m_{Net} \approx 45$ ng/cm$^2$) despite the large change in the behavior of each half-cycle. FIGS. 3A-3C show XPS data and analysis results for NaF film on silicon substrates. Deposition was performed at 200° C. with 100 ALD cycles of NaO$^t$Bu+HF-pyridine using 3-20-2-15 cycle timing. FIG. 3A shows a survey scan, FIG. 3B shows a sodium 1s region, and FIG. 3C shows a fluorine 1s region.

As a variety of dose and purge times were explored, increased purge times following NaO$^t$Bu doses were observed to cause a distinct change in process behavior. Micro-dosing experiments revealed that NaO$^t$Bu doses were not self-limiting for pulse-purge times of 3-60. This phenomenon associated with prolonged NaO$^t$Bu purge time was further investigated by depositing 100 ALD cycles of NaF on silicon substrates to determine whether the observed differences in mass change behavior would correlate with differences in film properties. Film thickness and composition was nearly identical for films deposited at 200° C. with a variety of cycle timing variations. It is believed that the mass loss during prolonged purges following each NaO$^t$Bu dose was due to the relatively slow decomposition and loss of tert-butoxide ligands, leaving dangling bonds on the surface that were able to react with subsequent repeated NaO$^t$Bu doses. However, following up with an HF-pyridine dose after the prolonged purge re-saturated the surface and yielded nearly identical net mass change and film properties, so this instability of the tert-butoxide ligands may be inconsequential for binary ALD of NaF at 200° C. Decomposition of the precursor seemed to negate the self-limiting nature of the sodium tert-butoxide precursor in the regime of long purge times.

Figures 5C, 5D:
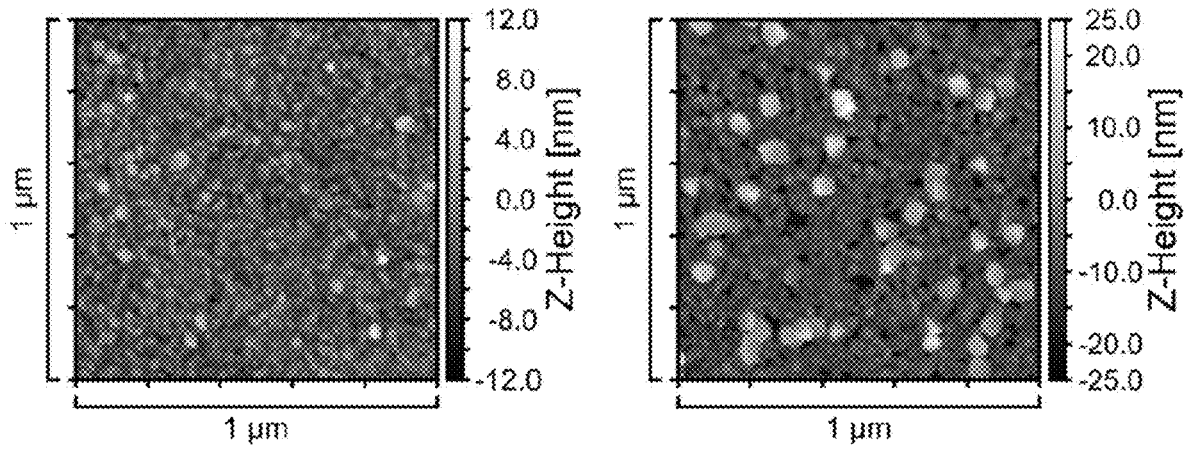

NaF films for ex situ characterization were deposited on Si(100) coupons via 100 ALD cycles of NaO$^t$Bu+HF-pyridine with 3-20-2-15 cycle timing. XPS revealed these films to be nearly stoichiometric NaF. Films grown at 175° C. and 200° C. yielded Na:F=1:1.05, while those grown at 225° C. and 250° C. yielded atomic ratios of 1:1.02 and 1:0.97, respectively. FIGS. 3A-3C show survey spectra and narrow scans of the Na 1s and F 1s regions for NaF deposited at 200° C. with 3-20-2-15 cycle timing. The survey spectra showed incidental contamination with Ti (all samples) and Cl (225° C. and 250° C. samples), which were attributed to precursor interactions with previously deposited Ti- and Cl-containing materials on the reactor walls. The Si 2s and Si 2p peaks in the survey scans indicated XPS signal from the substrate were included in the spectra; consequently, the carbon and oxygen peaks likely included signal from the native oxide and pre-existing adventitious carbon layers on the Si(100) substrates. The relative intensities of the Si peaks were markedly higher for films deposited at 250° C., which is believed attributed to film porosity (FIG. 5D). Although some of the C and O signal may have been the result of incomplete ALD surface reactions or decomposition of tert-butoxide ligands, precise chemical state identification was confounded by substrate effects. However, the combined C and O content including substrate signal was low (equivalent homogeneous composition of <4 at. % C and <2.5 at. % O for all samples), and total carbon and oxygen contamination within the deposited NaF films is expected to be minimal.

NaF films for SE modelling were deposited via 100 ALD cycles of NaO$^t$Bu+HF-pyridine with 3-20-2-15 cycle timing. NaF film thickness for 100 ALD cycles of NaO$^t$Bu+HF-pyridine was ~85 Å at 175° C. and 200° C. and increased to ~90 Å and ~111 Å at 225° C. and 250° C., respectively. Average NaF growth per cycle ("GPC") for various growth temperatures is shown in FIGS. 3A-3C. It should be noted that the GPC obtained from SE (~0.85 Å at 200° C.) is less than half of the minimum expected value based on QCM measurements (1.7 Å). This discrepancy might be attributed to differences in initial surface chemistry or crystallinity of the ALD NaF films, as the QCM crystal was coated with Al$_2$O$_3$ prior to each NaF deposition, while the silicon substrates with native oxide used for SE were directly coated with NaF. Although all SE fits yielded mean squared error values less than 2, the NaF Sellmeier model deviated from measured Delta data at higher wavelengths for 250° C. samples. This discrepancy may be due to film non-uniformity (FIG. 5D) and/or incidental chlorine contamination at higher growth temperatures.

Figure 5E:
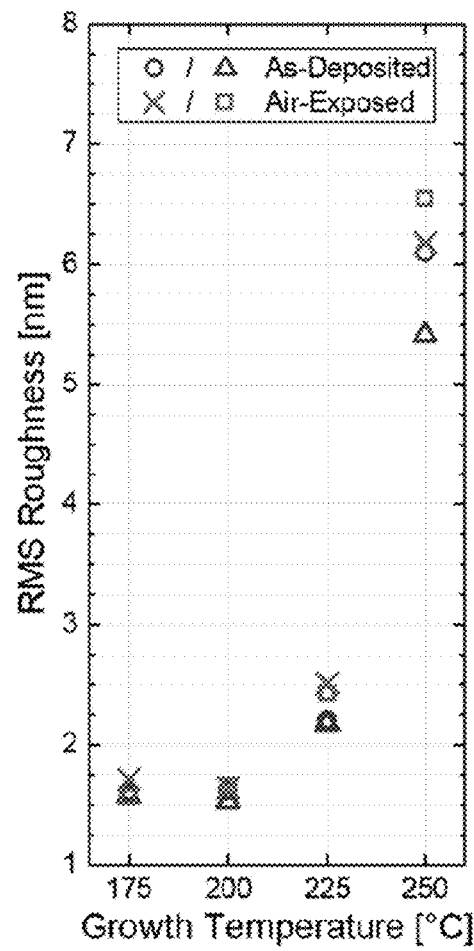
FIG. 5E shows surface roughness $R_q$ values for various growth temperatures (circle/triangle=as-deposited, X/square=air-exposed).
Figure 6A:
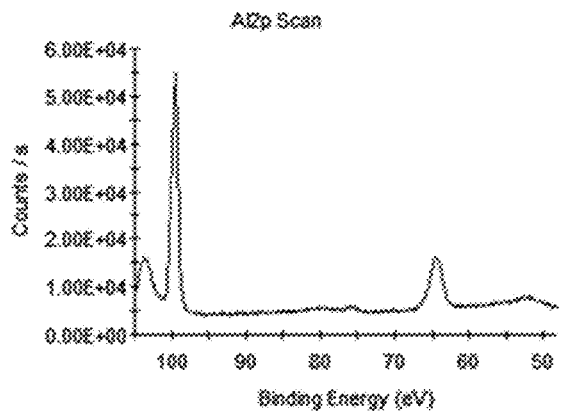
FIG. 6A-6H show XPS data for NaF coated Si Substrates where $WF_6$ is the fluoride precursor.
Figure 6B:
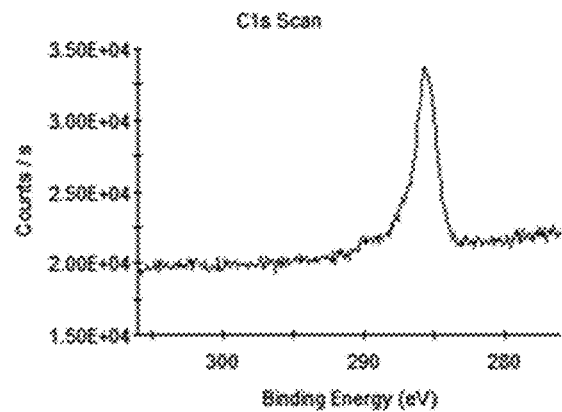
Figure 6C:
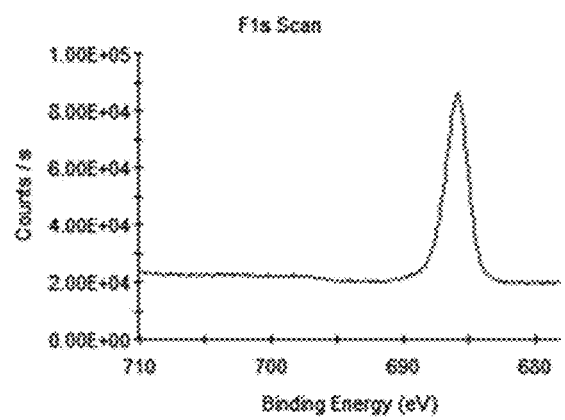
Figure 6D:
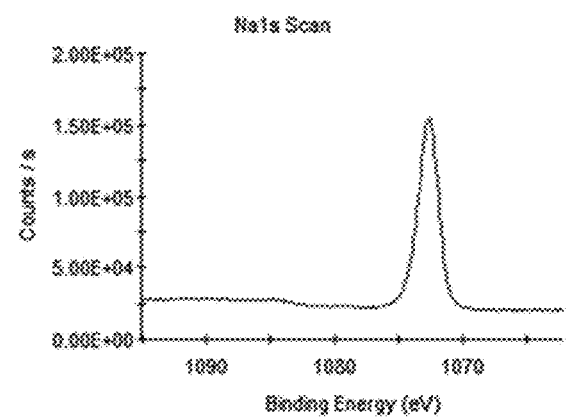
Figure 6E:
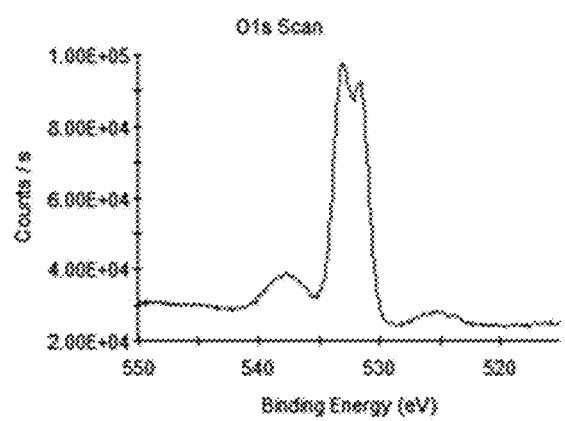
Figure 6F:
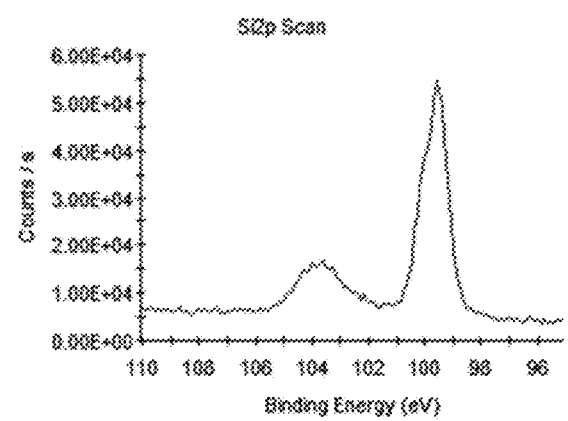
Figure 6G:
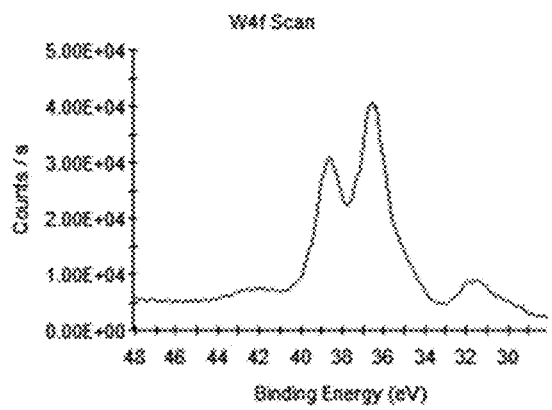
Figure 6H:
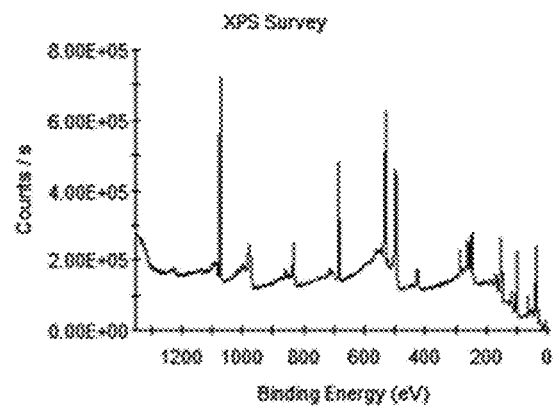
Figure 7A:
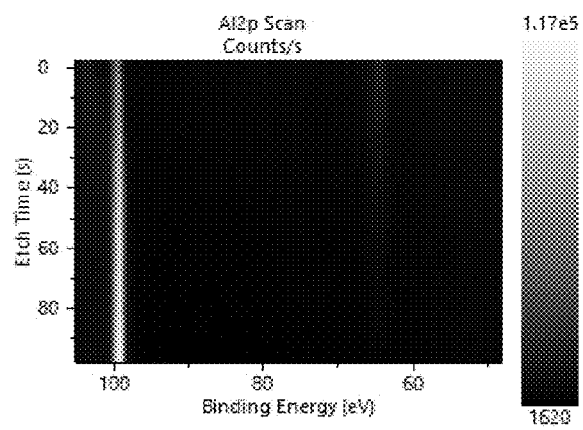
FIG. 7A-7H show XPS depth profile data for NaF coated Si Substrates where $WF_6$ is the fluoride precursor.
Figure 7B:
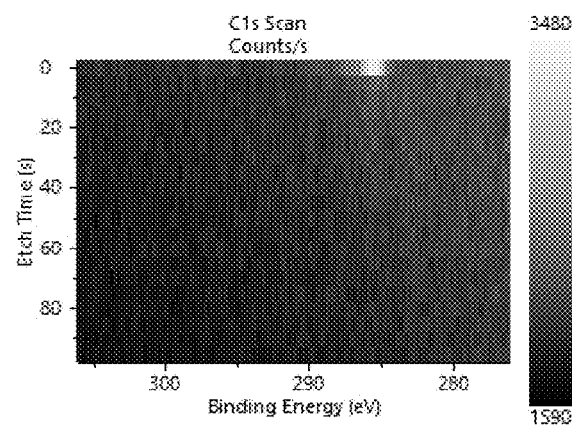
Figure 7C:
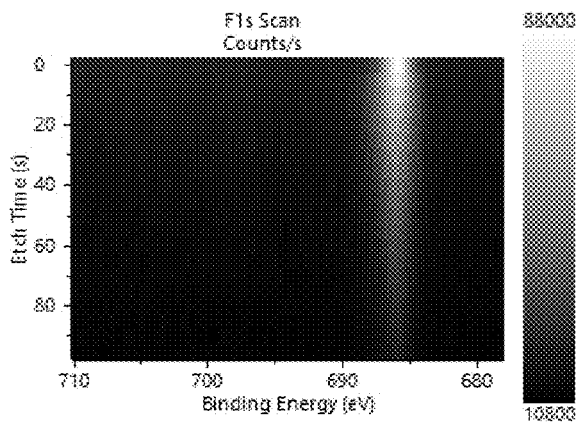
Figure 7D:
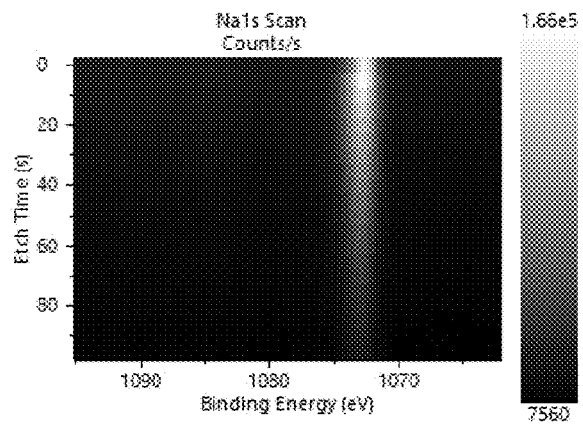
Figure 7E:
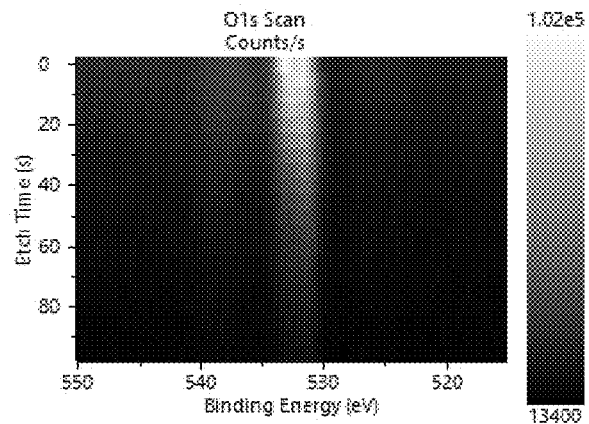
Figure 7F:
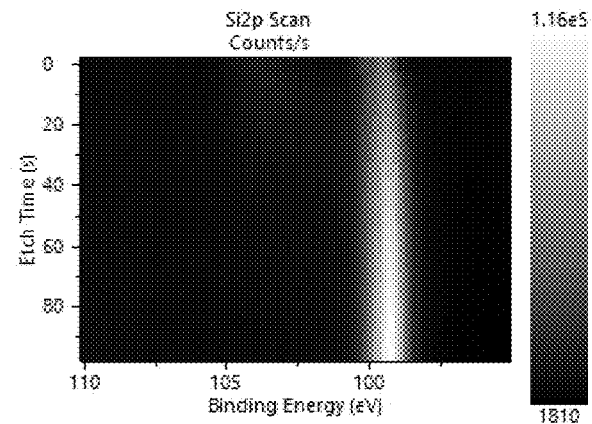
Figure 7G:
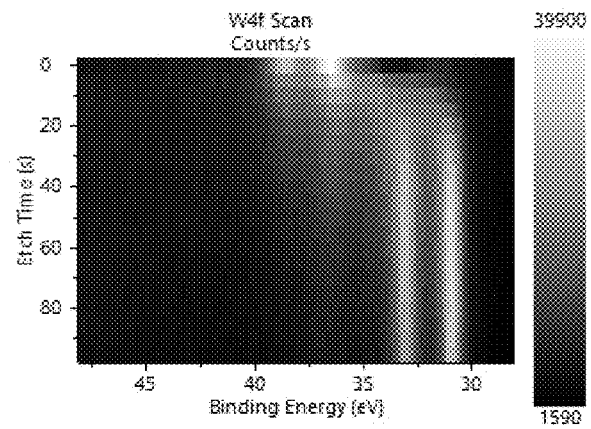
Figure 7H:
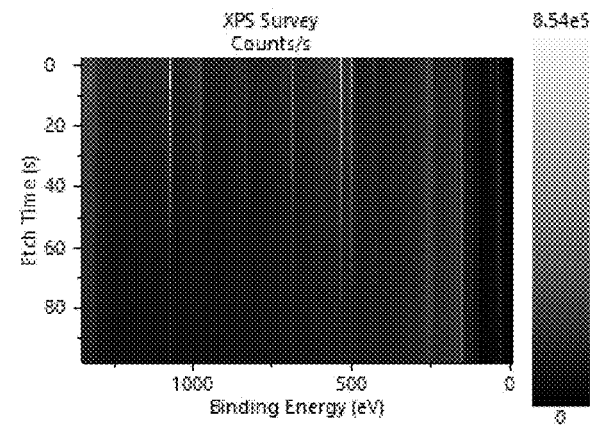
Figure 7I:
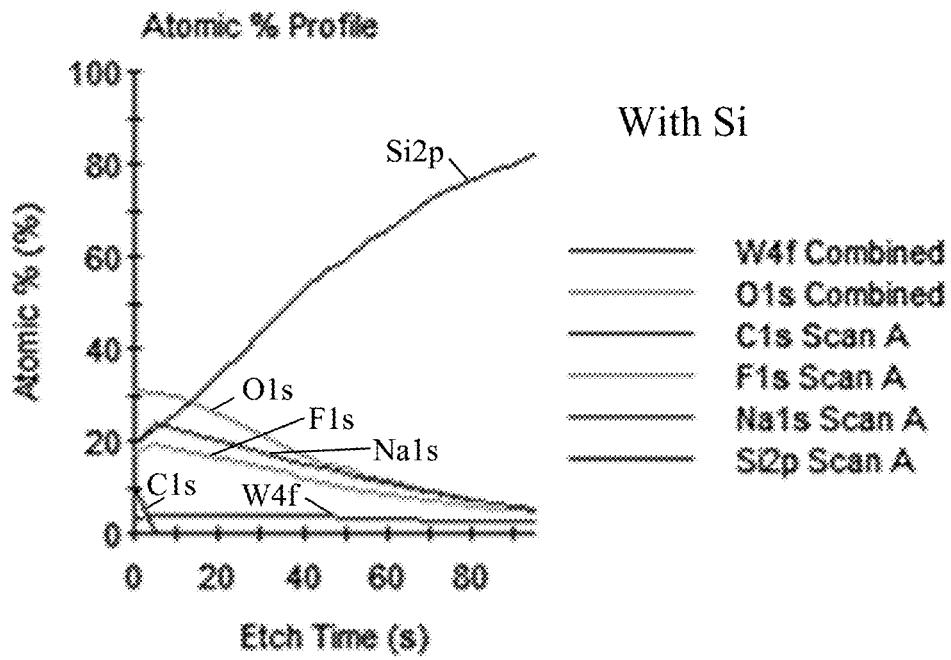
FIGS. 7I-7J show atomic percentage provide for the noted components with silicon (FIG. 7I and without (FIG. 7J).
Figure 7J:
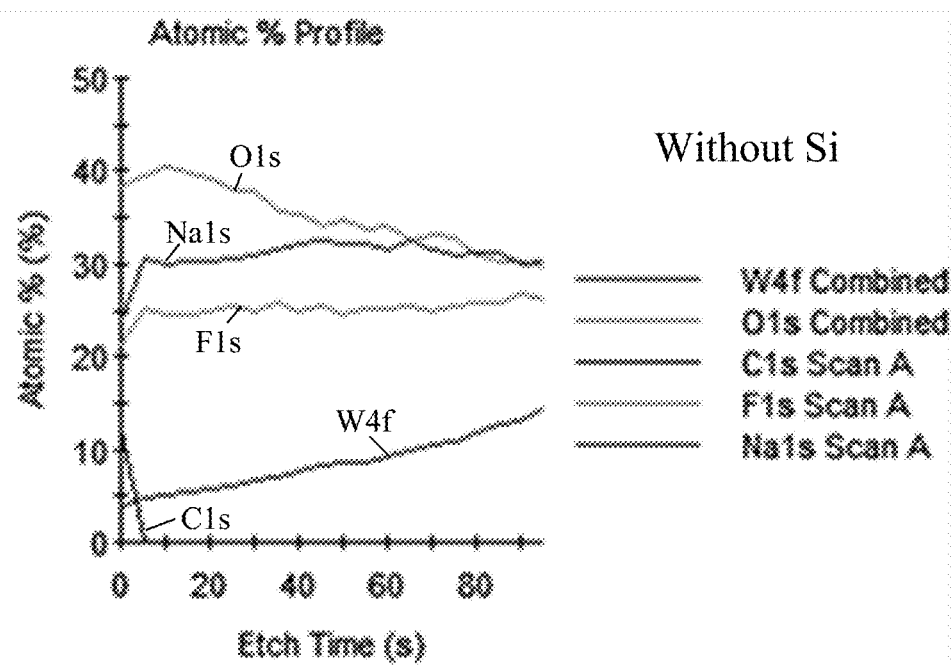
Figure 8A:
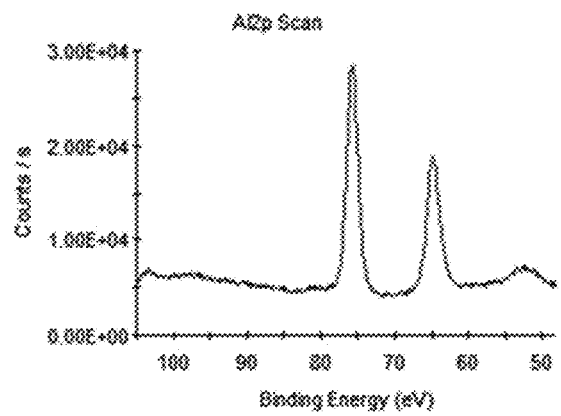
FIG. 8A-8H show XPS data for NaF coated ALO Substrates where $WF_6$ is the fluoride precursor.
Figure 8B:
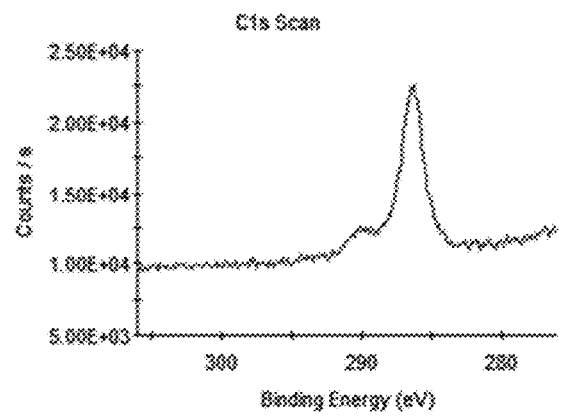
Figure 8C:
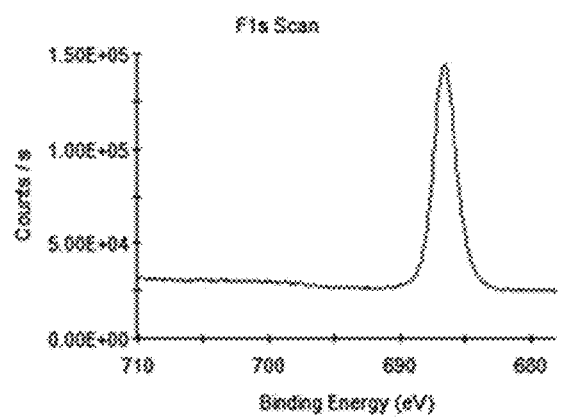
Figure 8D:
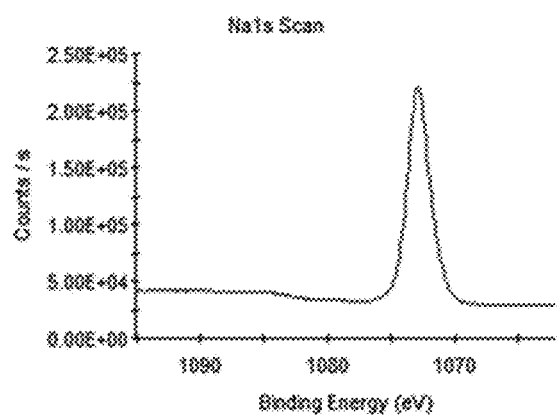
Figure 8E:
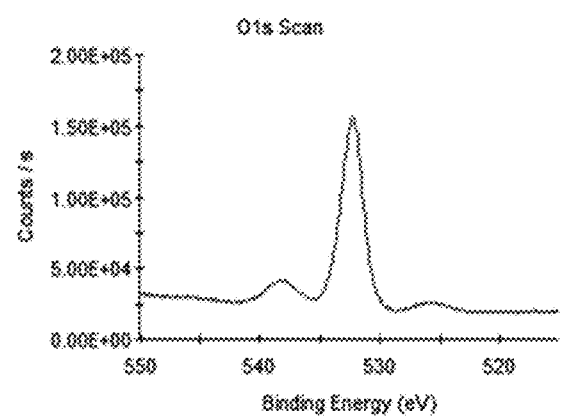
Figure 8F:
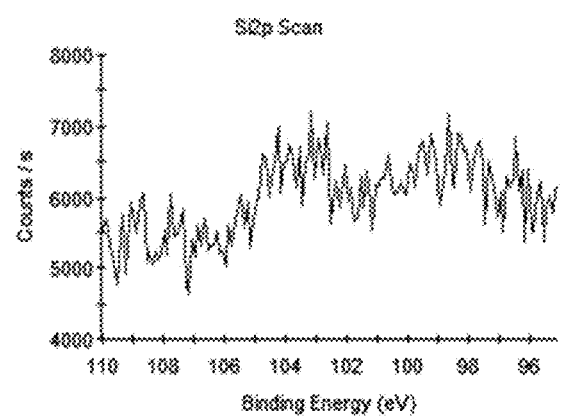
Figure 8G:
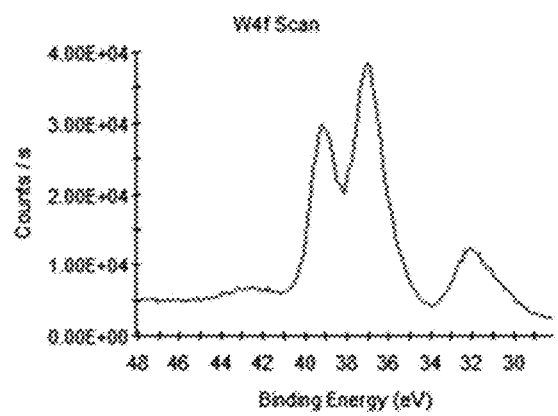
Figure 8H:
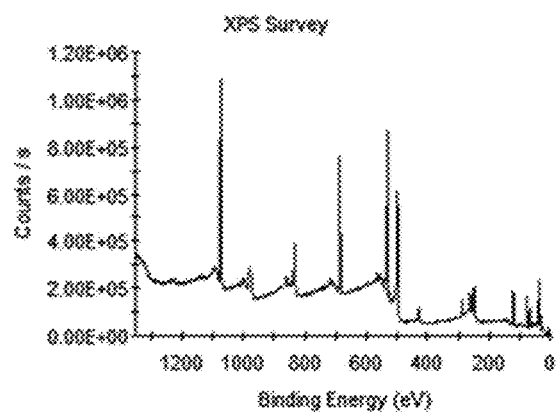
Figure 9A:
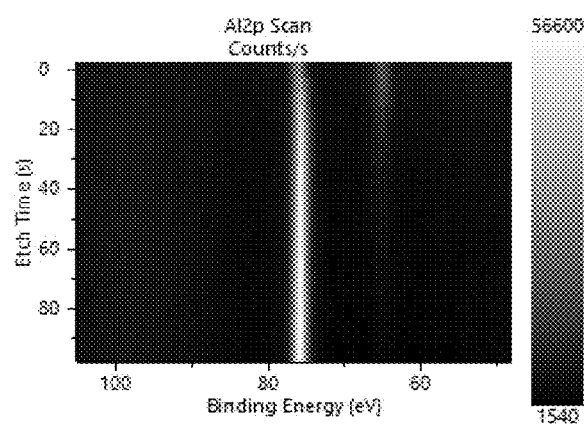
FIG. 9A-9H show XPS depth profile data for NaF coated ALO Substrates where $WF_6$ is the fluoride precursor.
Figure 9B:
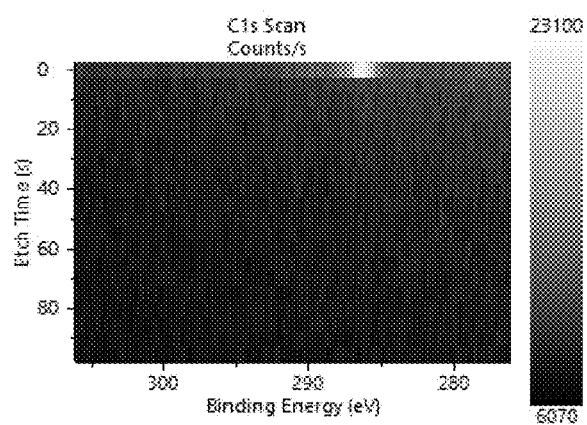
Figure 9C:
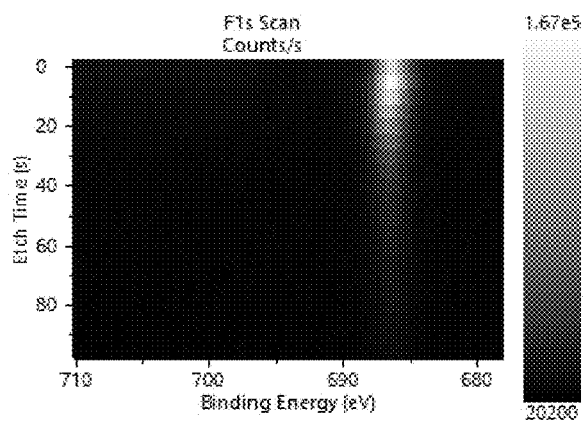
Figure 9D:
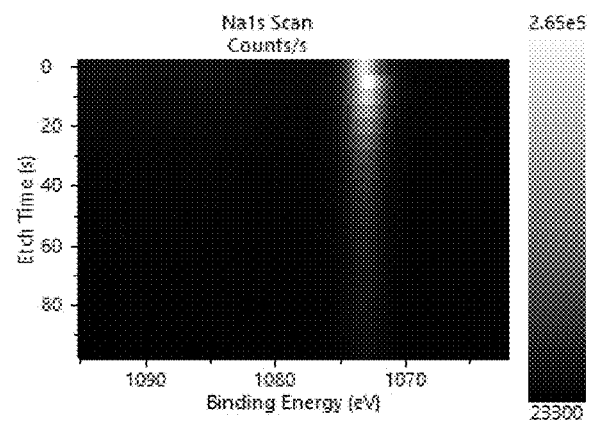
Figure 9E:
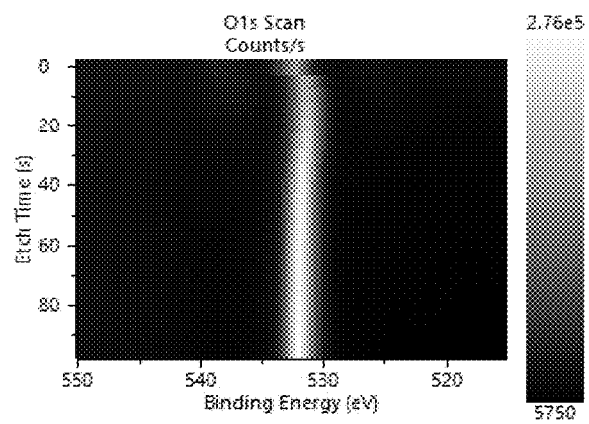
Figure 9F:
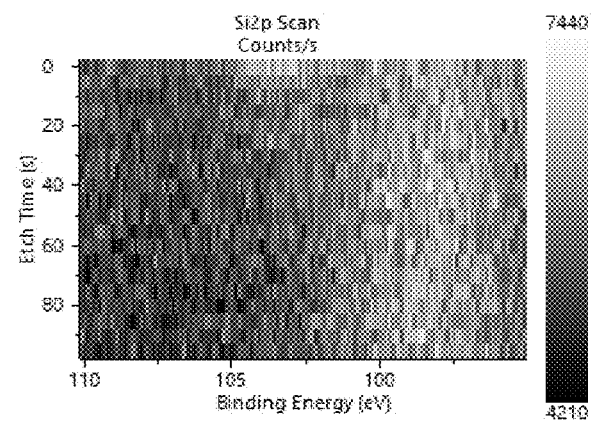
Figure 9G:
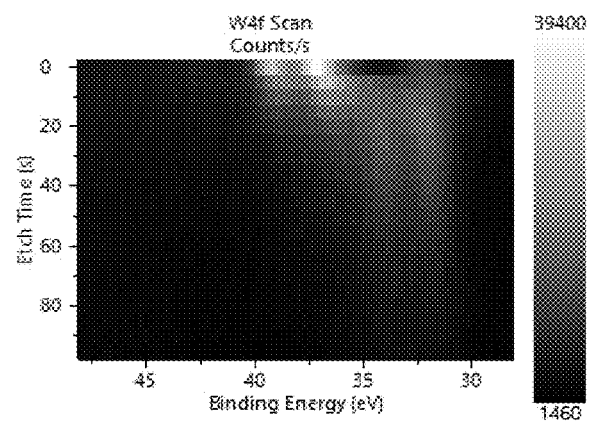
Figure 9H:
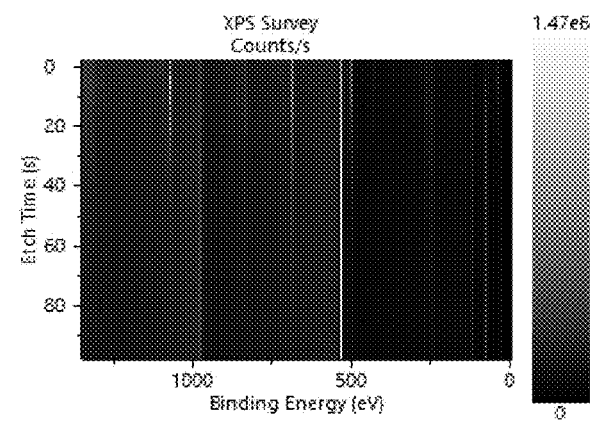
Figure 9I:
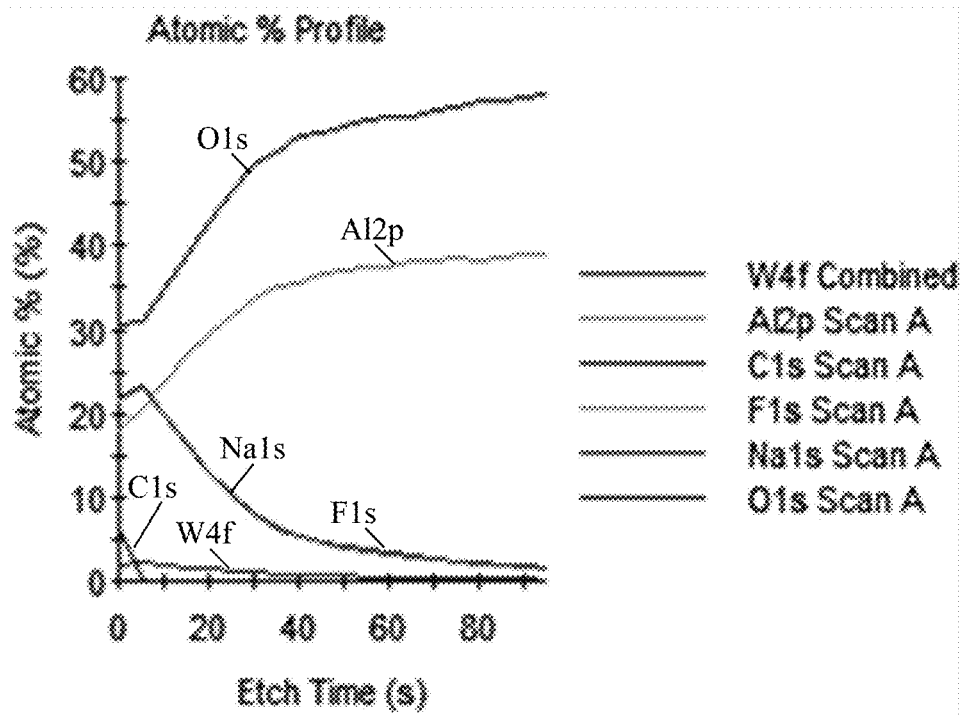
FIGS. 9I-9J show atomic percentage provide for the noted components with silicon (FIG. 9I and without (FIG. 9J).
Figure 9J:
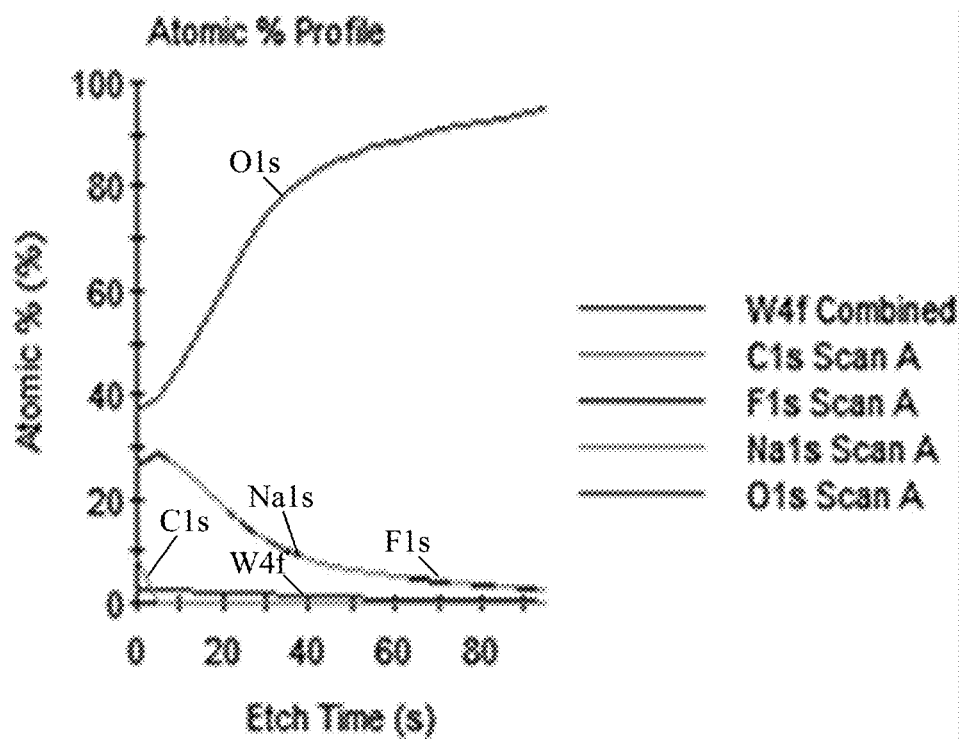

Finally, atomic force microscopy and scanning electron microscopy were used to characterize the film morphology. AFM images for as-deposited samples are shown in FIGS. 5A-5E. Root mean square roughness ($R_q$) values for the 175° C. and 200° C. as-deposited samples were both ~1.6 nm. Roughness values increased with temperature, and at 225° C. and 250° C. the measured $R_q$ values were ~2.2 nm and ~5.8 nm, respectively. It is noted that $R_q$ values of several nm are typical for crystalline ALD films in this thickness range, whereas amorphous ALD films in this thickness range exhibit $R_q$ values well below 1 nm. This finding is sensible given that NaF is an ionic solid and should readily crystallize even at low growth temperatures. Air-exposed samples showed similar trends in roughness at elevated growth temperatures and had $R_q$ values slightly higher than as-deposited samples (FIG. 5E). This increase in $R_q$ for air-exposed films may be due to water adsorption. NaF is known to be hygroscopic and the adsorption of H$_2$O vapor from the ambient environment would cause volume expansion and an increase in surface roughness. Film morphology evolved with temperature, with small pores and cubic crystallite structures forming on the NaF surface at 250° C., as shown in FIG. 5D. The pores may have resulted from de-wetting of the ALD NaF from the native silicon oxide surface at the higher growth temperatures.

FIGS. 6-9 show results and tests relating to the use of the ALD process as described with WF$_6$ as the fluorine precursor on both Si and ALO substrates, demonstrating NaF growth. For the tests reported, the reaction temperatures was 175 with 50 ALD cycles. The sodium precursor was provided with a bubbler temperature of 140 C. FIG. 6A-H show XPS data for NaF coated Si Substrates where WF$_6$ is the fluoride precursor. FIG. 7A-H show XPS depth profile data for NaF coated Si Substrates where WF$_6$ is the fluoride precursor; FIGS. 7I-J shows atomic percentage provide for the noted components with silicon (FIG. 7I and without (FIG. 7J). FIG. 8A-H show XPS data for NaF coated ALO Substrates where WF$_6$ is the fluoride precursor. FIG. 9A-H show XPS depth profile data for NaF coated ALO Substrates where WF$_6$ is the fluoride precursor; FIGS. 9I-J shows atomic percentage provide for the noted components with silicon (FIG. 9I and without (FIG. 9J).

Uniform growth was observed across the reactor but higher growth was seen on the LAO substrate compared to Si substrate.

Summary and Conclusions.

Described herein is a binary chemistry for ALD of NaF with an optimal growth temperature of 175-200° C. Films deposited in this temperature range had an atomic ratio of Na:F=1:1.05 and surface roughness of 1.6 nm. Optical properties were consistent with bulk values and growth per cycle was roughly 0.85 Å. Films grown at higher temperatures of 225-250° C. had increased surface roughness (2.2 and 5.8 nm, respectively), with pores and cubic surface crystallites forming at 250° C. Standard timing for the NaO$^t$Bu+HF-pyridine ALD cycle was 3-20-2-15s. Increased purge time following the NaO$^t$Bu dose led to the decomposition and loss of O$^t$Bu ligands from the growth surface, but binary NaF ALD was largely unaffected by the instability of O$^t$Bu groups as subsequent HF-pyridine doses re-saturated the growth surface. These results may offer significant benefit for applications of NaF thin films in applications for both solar cells and advanced batteries.

Definitions.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

We claim:

1. A method for deposition of sodium fluoride comprising:
   providing a substrate;
   performing an atomic layer deposition having:
   a first half reaction exposing a sodium precursor to the substrate at a first half reaction temperature, forming a sodium intermediate; and
   a second half reaction exposing a fluorine precursor to the sodium intermediate; and
   reacting the sodium intermediate with the fluorine precursor forming a sodium fluoride coating on the substrate.

2. The method of claim 1, wherein the substrate is silicon, quartz, ALO, carbon nanotubes, cathodes, or silicon oxide.

3. The method of claim 1, wherein the sodium precursor is tert-butoxide.

4. The method of claim 3, wherein the sodium intermediate is Na(O$^t$Bu)$_{1-x}$.

5. The method of claim 1, wherein the fluorine precursor is selected from the group consisting of sulfur tetrafluoride, ammonium fluoride, WF$_6$, and/or Hf-pyridine.

6. The method of claim 1, wherein the first half reaction temperature is 175-250° C.

7. The method of claim 1, further comprising a first purge step after the first half reaction exposure, the first purge step including exposure of a purge gas to the substrate and purging the sodium precursor.

8. The method of claim 1, further comprising a second purge step after the second half reaction exposure, the second purge step including exposure of a purge gas to the substrate and purging the fluorine precursor.

9. A method for deposition of sodium fluoride comprising:
   providing a substrate;
   performing an atomic layer deposition having:
   a first half reaction exposing a sodium precursor to the substrate at a first half reaction temperature, forming a sodium intermediate; and
   a second half reaction exposing a Hf-pyridine precursor to the sodium intermediate; and
   reacting the sodium intermediate with the Hf-pyridine precursor forming a sodium fluoride coating on the substrate.

10. The method of claim 9, wherein the substrate is silicon, quartz, ALO, carbon nanotubes, cathodes, or silicon oxide.

11. The method of claim 9, wherein the sodium precursor is tert-butoxide.

12. The method of claim 11, wherein the sodium intermediate is Na(O$^t$Bu)$_{1-x}$.

13. The method of claim 9, further comprising a first purge step after the first half reaction exposure, the first purge step including exposure of a purge gas to the substrate and purging the sodium precursor.

14. The method of claim 9, further comprising a second purge step after the second half reaction exposure, the second purge step including exposure of a purge gas to the substrate and purging the fluorine precursor.

15. A method for deposition of sodium fluoride comprising:
provide a substrate;
performing an atomic layer deposition having:
a first half reaction exposing a sodium precursor to the substrate at a first half reaction temperature, forming a sodium intermediate; and
a second half reaction exposing a $WF_6$ precursor to the sodium intermediate; and
reacting the sodium intermediate with the $WF_6$ precursor forming a sodium fluoride coating on the substrate.

16. The method of claim 15, wherein the substrate is silicon, quartz, ALO, carbon nanotubes, cathodes, or silicon oxide.

17. The method of claim 15, wherein the sodium precursor is tert-butoxide.

18. The method of claim 17, wherein the sodium intermediate is $Na(O^tBu)_{1-x}$.

19. The method of claim 15, further comprising a first purge step after the first half reaction exposure, the first purge step including exposure of a purge gas to the substrate and purging the sodium precursor.

20. The method of claim 15, further comprising a second purge step after the second half reaction exposure, the second purge step including exposure of a purge gas to the substrate and purging the fluorine precursor.

* * * * *